(12) United States Patent
More et al.

(10) Patent No.: US 10,879,126 B2
(45) Date of Patent: Dec. 29, 2020

(54) SEMICONDUCTOR DEVICE AND METHOD

(71) Applicant: Taiwan Semiconductor Manufacturing Company, Ltd., Hsinchu (TW)

(72) Inventors: Shahaji B. More, Hsinchu (TW); Zheng-Yang Pan, Zhubei (TW); Cheng-Han Lee, New Taipei (TW); Shih-Chieh Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/390,516

(22) Filed: Apr. 22, 2019

(65) Prior Publication Data

US 2019/0244864 A1    Aug. 8, 2019

Related U.S. Application Data

(62) Division of application No. 15/617,331, filed on Jun. 8, 2017, now Pat. No. 10,269,646.

(Continued)

(51) Int. Cl.
*H01L 21/8234* (2006.01)
*H01L 21/768* (2006.01)
(Continued)

(52) U.S. Cl.
CPC ........ *H01L 21/823431* (2013.01); *H01L 21/02532* (2013.01); *H01L 21/28518* (2013.01); *H01L 21/76802* (2013.01); *H01L 21/76889* (2013.01); *H01L 21/823418* (2013.01); *H01L 29/41791* (2013.01); *H01L 29/45* (2013.01); *H01L 29/665* (2013.01); *H01L 29/66795* (2013.01); *H01L 29/7851* (2013.01); *H01L 21/76843* (2013.01);
(Continued)

(58) Field of Classification Search
None
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

FOREIGN PATENT DOCUMENTS

KR    20100056813 A    5/2010

OTHER PUBLICATIONS

Peterson, et al. "Schottky and ohmic contacts to doped Si1-x-yGexCy layers," Solid-State Electronics 43 (1999) pp. 1725-1734, received Nov. 29, 1998; accepted Feb. 9, 1999.

*Primary Examiner* — Jack S Chen
(74) *Attorney, Agent, or Firm* — Slater Matsil, LLP

(57) ABSTRACT

A semiconductor device and method includes: forming a gate stack over a substrate; growing a source/drain region adjacent the gate stack, the source/drain region being n-type doped Si; growing a semiconductor cap layer over the source/drain region, the semiconductor cap layer having Ge impurities, the source/drain region free of the Ge impurities; depositing a metal layer over the semiconductor cap layer; annealing the metal layer and the semiconductor cap layer to form a silicide layer over the source/drain region, the silicide layer having the Ge impurities; and forming a metal contact electrically coupled to the silicide layer.

20 Claims, 25 Drawing Sheets

Related U.S. Application Data

(60) Provisional application No. 62/434,895, filed on Dec. 15, 2016.

(51) Int. Cl.
  *H01L 21/02* (2006.01)
  *H01L 29/78* (2006.01)
  *H01L 29/66* (2006.01)
  *H01L 29/417* (2006.01)
  *H01L 29/45* (2006.01)
  *H01L 21/285* (2006.01)
  *H01L 21/8238* (2006.01)

(52) U.S. Cl.
  CPC ............... *H01L 21/76855* (2013.01); *H01L 21/823814* (2013.01); *H01L 29/66545* (2013.01); *H01L 29/7848* (2013.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2005/0280098 A1* | 12/2005 | Shin | H01L 21/82381 257/371 |
| 2008/0265417 A1* | 10/2008 | Kawamura | H01L 21/28518 257/751 |
| 2010/0123198 A1* | 5/2010 | Kim | H01L 21/26506 257/377 |
| 2010/0276761 A1 | 11/2010 | Tung et al. | |
| 2012/0056245 A1 | 3/2012 | Kang et al. | |

* cited by examiner

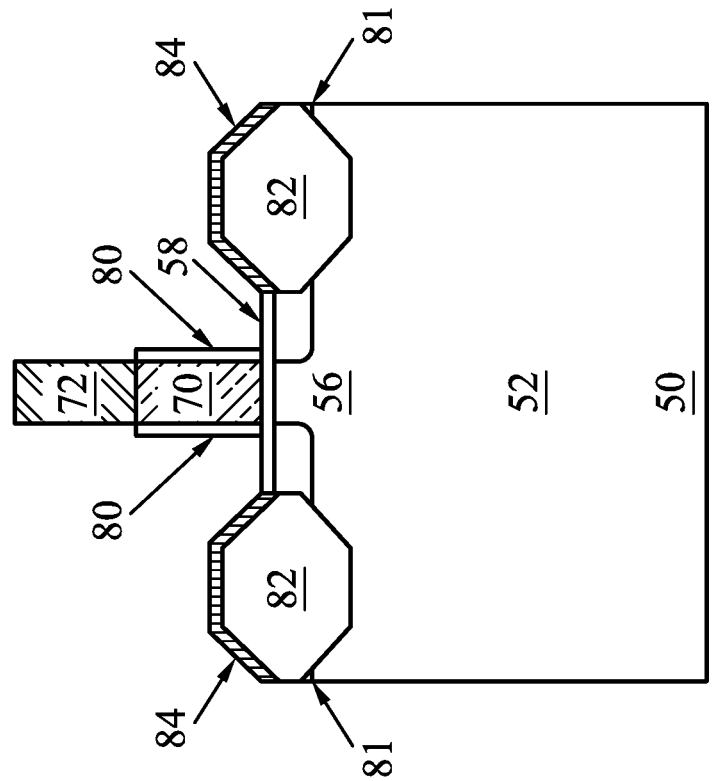
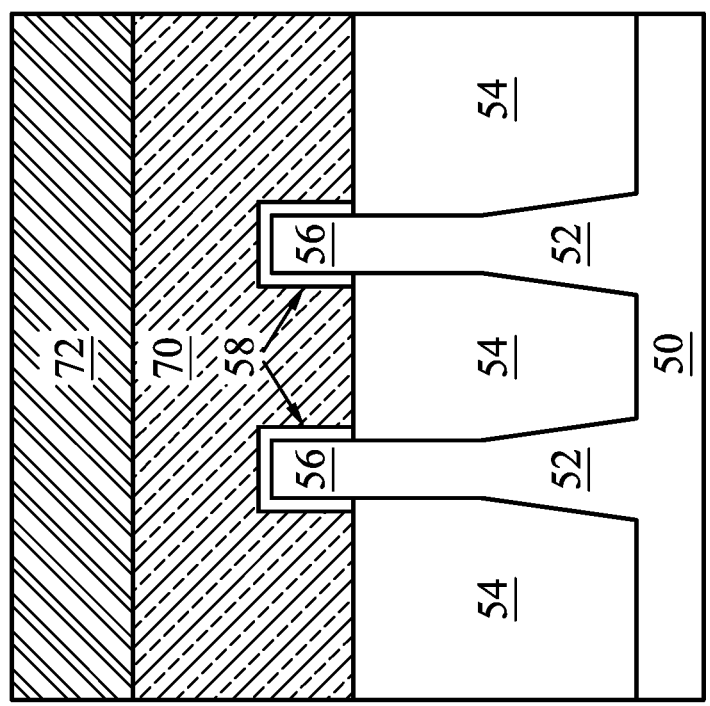
Figure 9A
Figure 9B

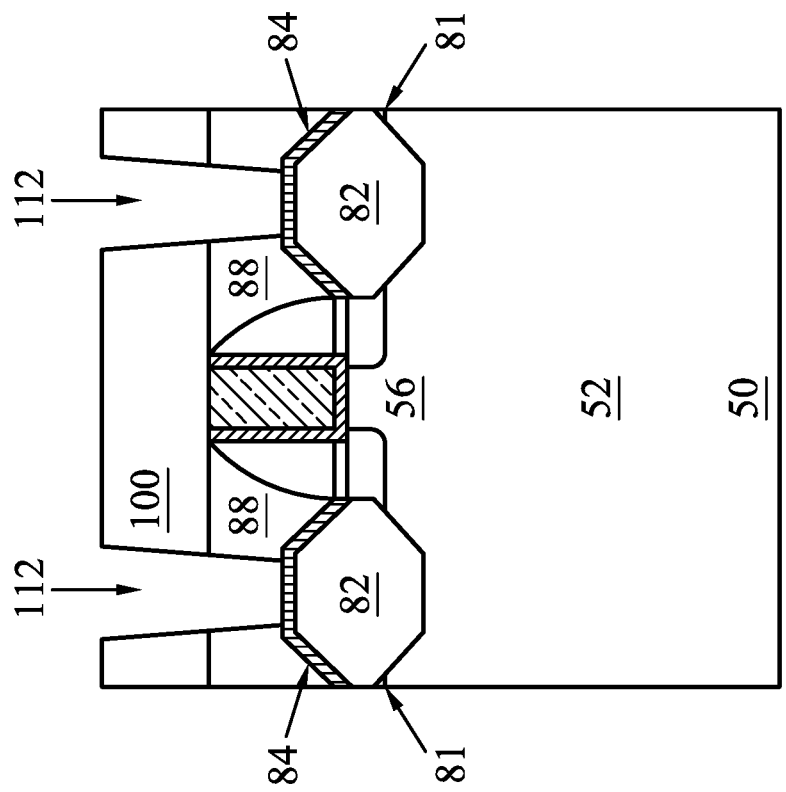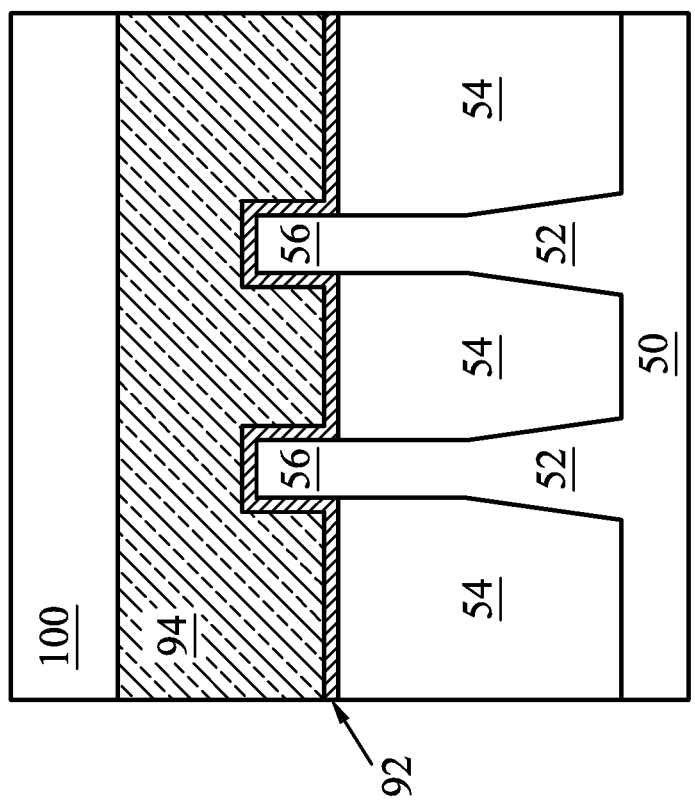
Figure 16A
Figure 16B

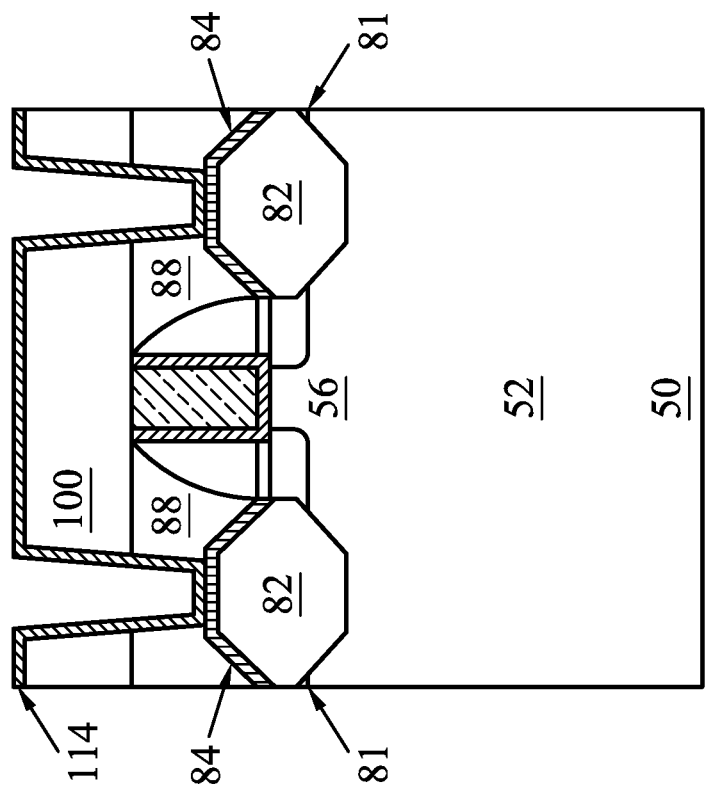
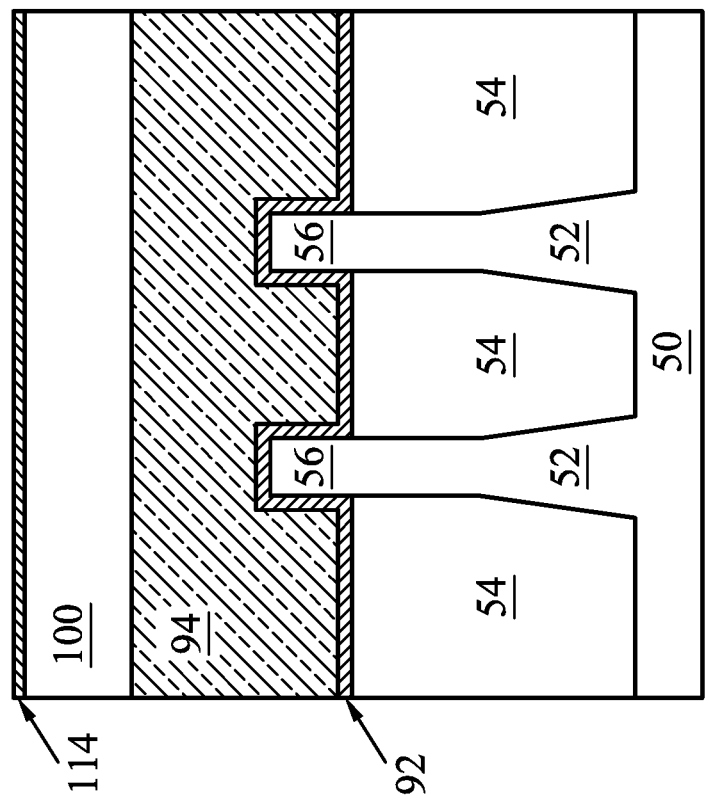
Figure 17A
Figure 17B

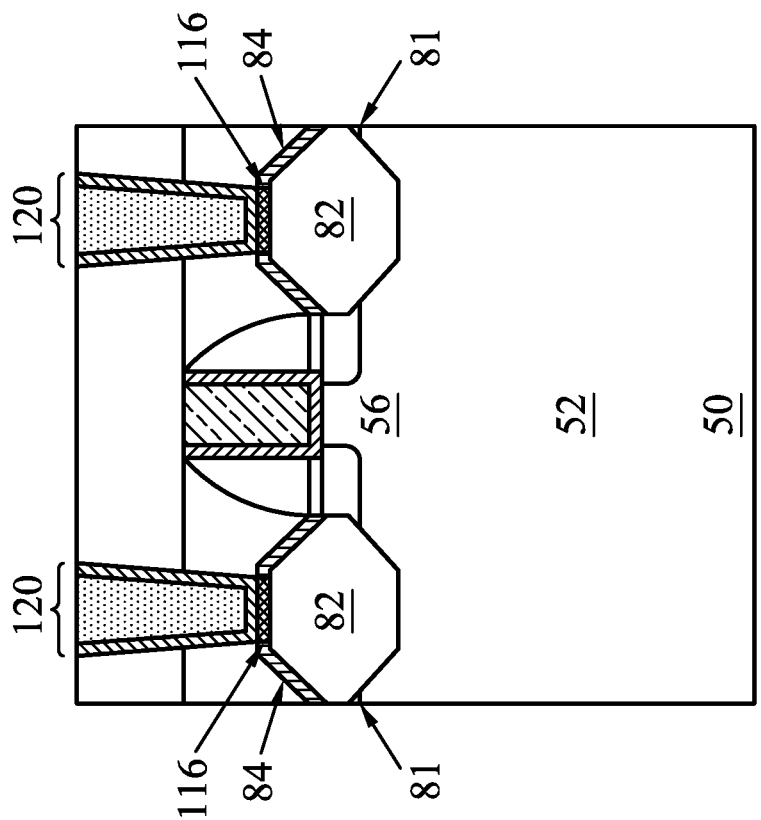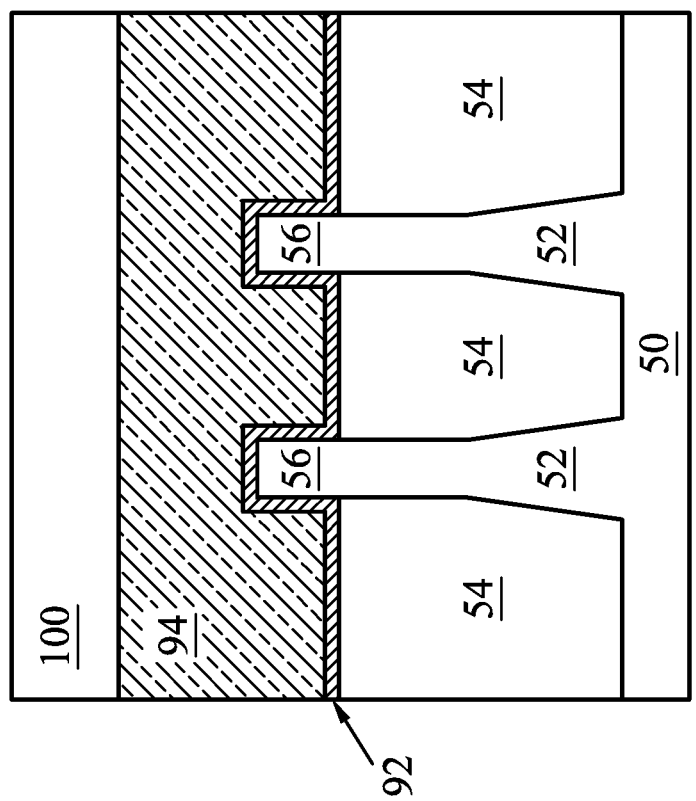
Figure 20A
Figure 20B

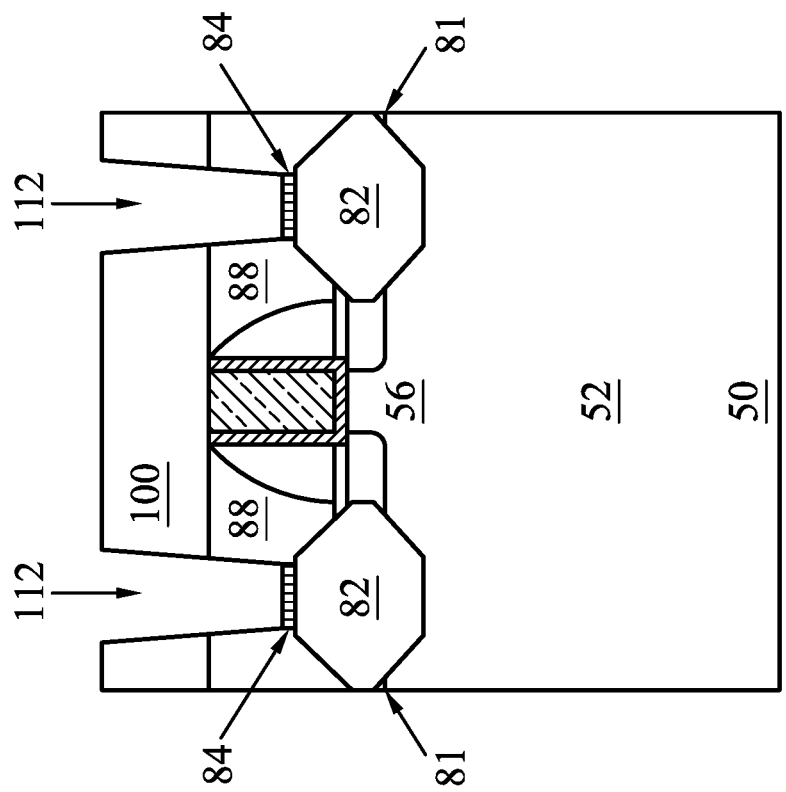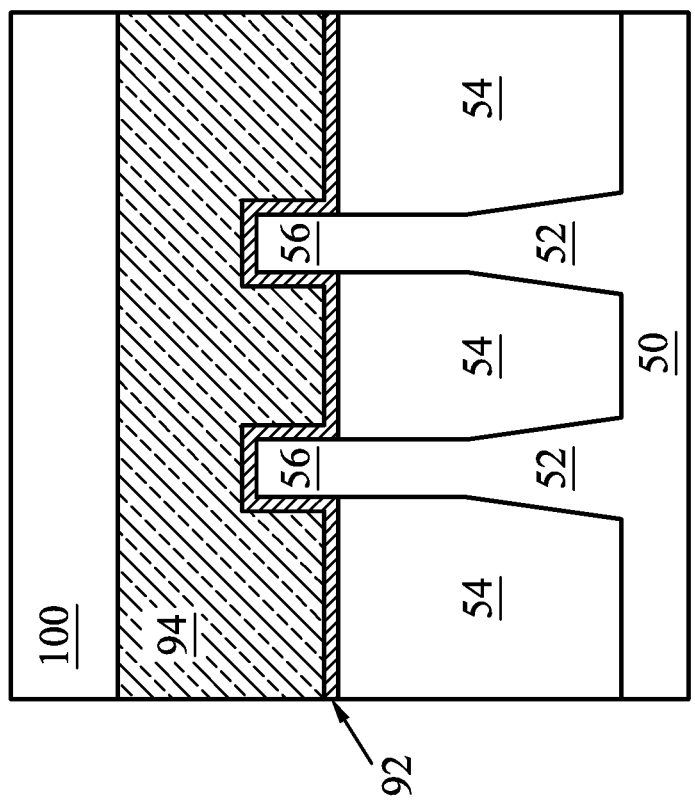
Figure 22A
Figure 22B

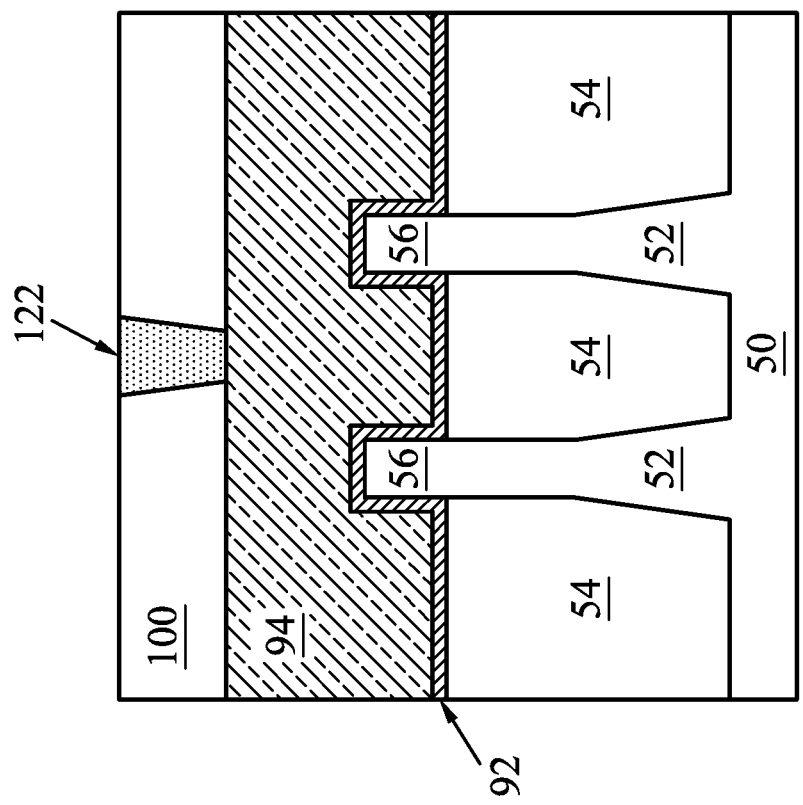
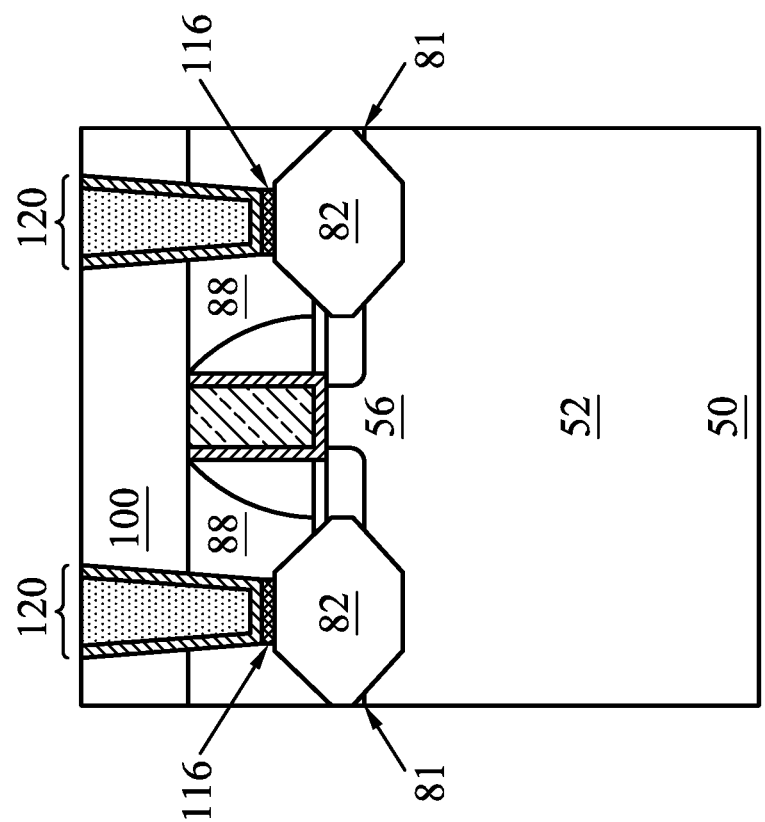
Figure 23A
Figure 23B

SEMICONDUCTOR DEVICE AND METHOD

PRIORITY CLAIM AND CROSS-REFERENCE

This application is a division of U.S. patent application Ser. No. 15/617,331, filed on Jun. 8, 2017 which claims the benefit of U.S. Provisional Application No. 62/434,895, filed on Dec. 15, 2016, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, 18B, 18C, 19A, 19B, 20A, 20B, 20C, 21A, and 21B are cross-sectional views of intermediate stages in the manufacturing of FinFETs, in accordance with some embodiments.

FIGS. 22A, 22B, 23A, and 23B are cross-sectional views of intermediate stages in the manufacturing of FinFETs, in accordance with some embodiments.

DETAILED DESCRIPTION

Figure 1:
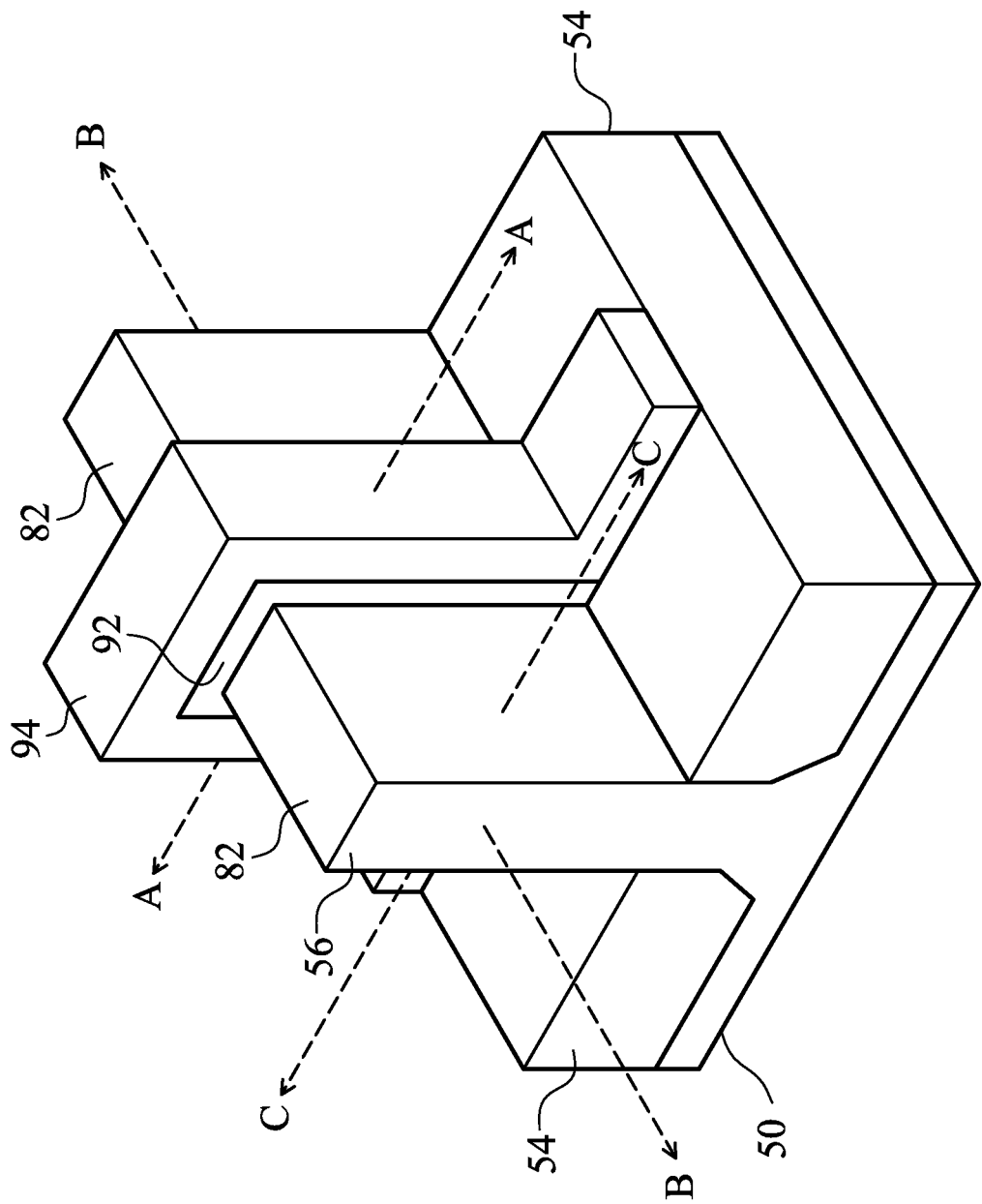
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device and method of forming the same is provided in accordance with various embodiments. In particular, a semiconductor cap layer is formed over a source/drain region after the source/drain region is epitaxially grown. In subsequent steps, an inter-layer dielectric (ILD) is formed over the semiconductor device, and an opening in the ILD is formed, exposing the semiconductor cap layer. A metal is deposited in the opening and is annealed with semiconductor cap layer to produce a silicide. A contact is then formed electrically coupled to the silicide. In an embodiment, the source/drain region is an epitaxially grown n-doped Si region, the semiconductor cap layer is a SiGe layer epitaxially grown on the n-doped Si region, and the metal is Ti. Annealing the metal and semiconductor cap layer forms a $TiSi_2$ silicide that is rich with Ge. The series resistance of the source/drain contact ($R_c$) may be varied relative to the series resistance of the of the silicide ($R_S$) by varying the amount of Ge in the silicide. The amount of Ge formed in the silicide may be optimized or at least improved, reducing power leakage caused by the driving current being driven through $R_c$ and $R_S$, which increase with the decreasing contact areas of shrinking devices. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIG. 1 illustrates an example of a FinFET in a three-dimensional view. The FinFET comprises a fin 56 on a substrate 50. Isolation regions 54 are formed over the substrate 50, and the fin 56 protrudes above and from between neighboring isolation regions 54. A gate dielectric 92 is along sidewalls and over a top surface of the fin 56, and a gate electrode 94 is over the gate dielectric 92. Source/drain regions 82 are disposed in opposite sides of the fin 56 with respect to the gate dielectric 92 and gate electrode 94. FIG. 1 further illustrates reference cross-sections that are used in later figures. Cross-section A-A is across a channel, gate dielectric 92, and gate electrode 94 of the FinFET. Cross-section B-B is perpendicular to cross-section A-A and is along a longitudinal axis of the fin 56 and in a direction of, for example, a current flow between the source/drain regions 82. Cross-section C-C is parallel to cross-section A-A and is across a source/drain region 82 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 6 are cross-sectional views of intermediate stages in the manufacturing of FinFETs in accordance with exemplary embodiments. FIGS. 2 through 6 illustrate reference cross-section A-A illustrated in FIG. 1, except for multiple FinFET.

Figure 2:
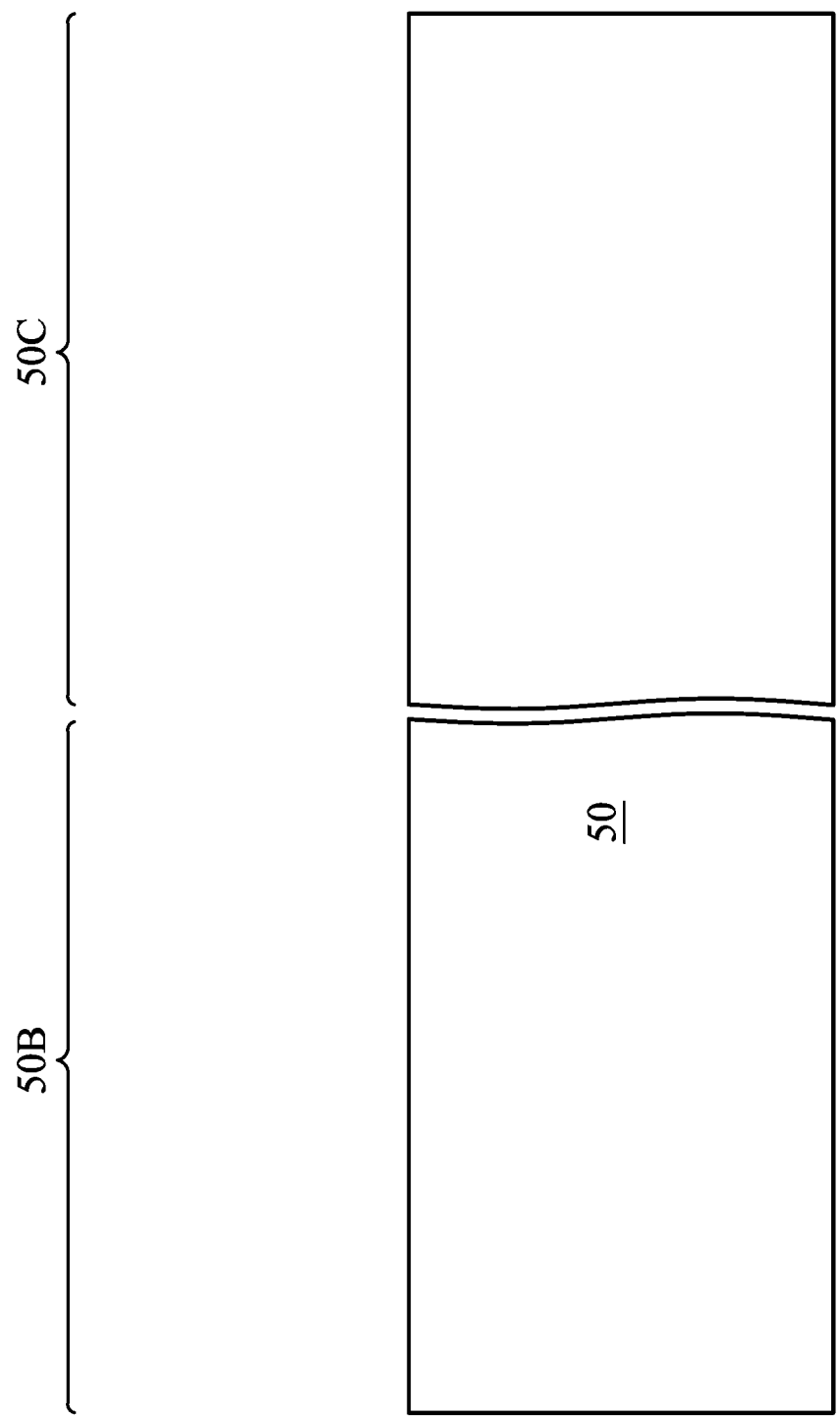

In FIG. 2, a substrate 50 is formed. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B can be for forming n-type devices, such as NMOS transistors, e.g., n-type FinFETs. The second region 50C can be for forming p-type devices, such as PMOS transistors, e.g., p-type FinFETs. In some embodiments, both the first region 50B and the second region 50C are used to form the same type of devices, such as both regions being for n-type devices or p-type devices.

Figure 3:
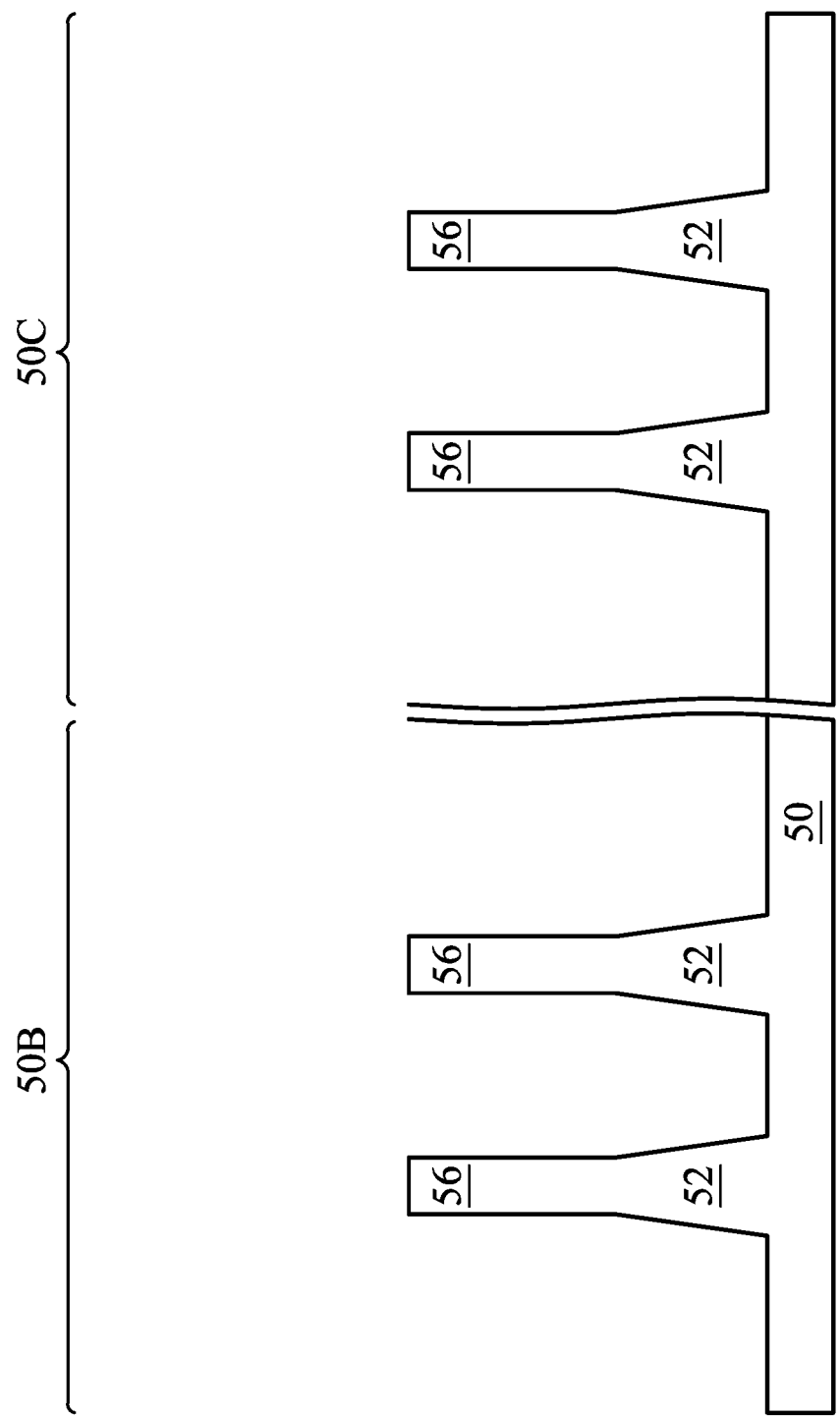

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Figure 4:
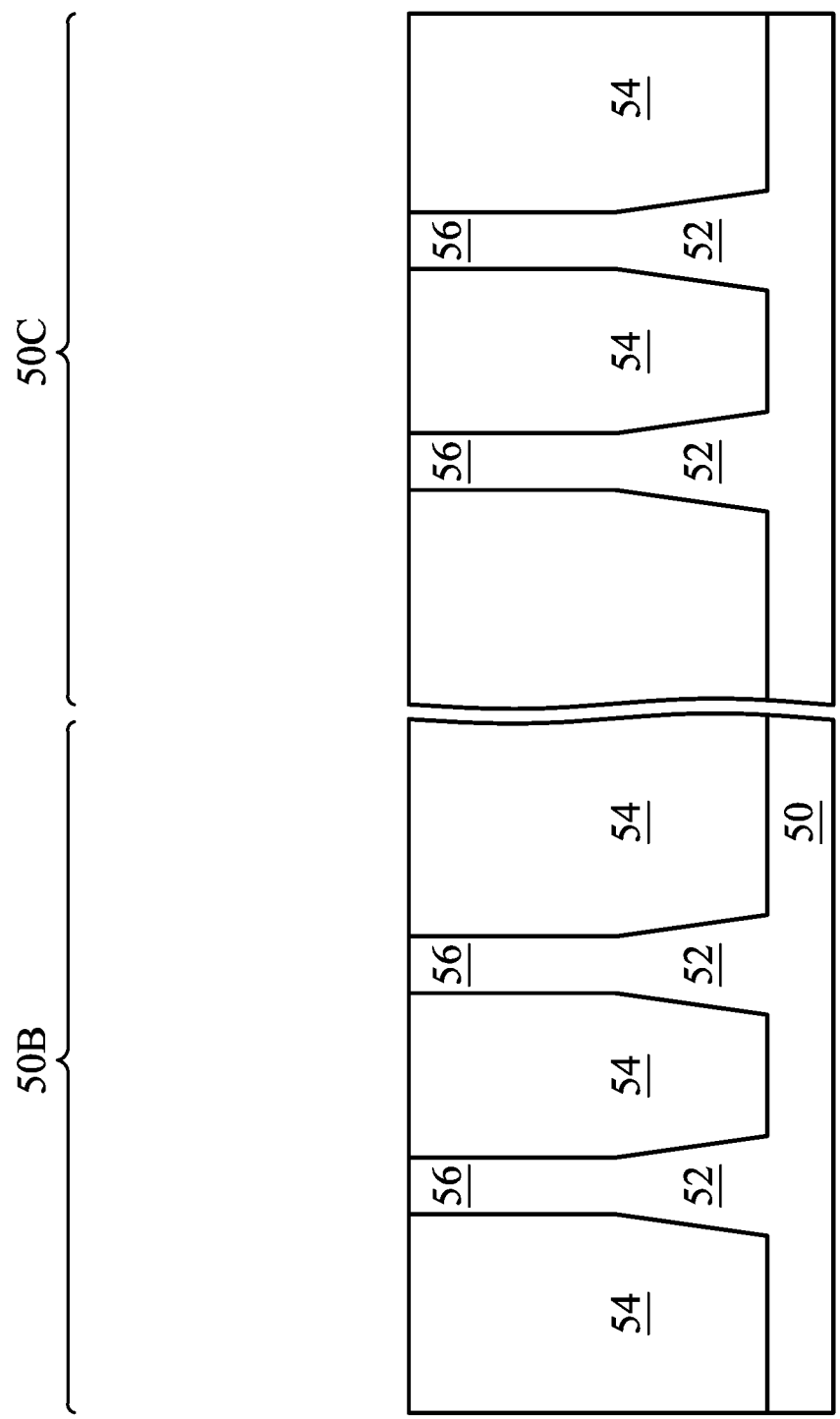

In FIG. 4, an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. The insulating material 54 may be referred to as isolation regions 54. Further in FIG. 4, a planarization process, such as a chemical mechanical polish (CMP), may remove any excess insulation material 54 and form top surfaces of the isolation regions 54 and top surfaces of the fins 52 that are level.

Figure 5:
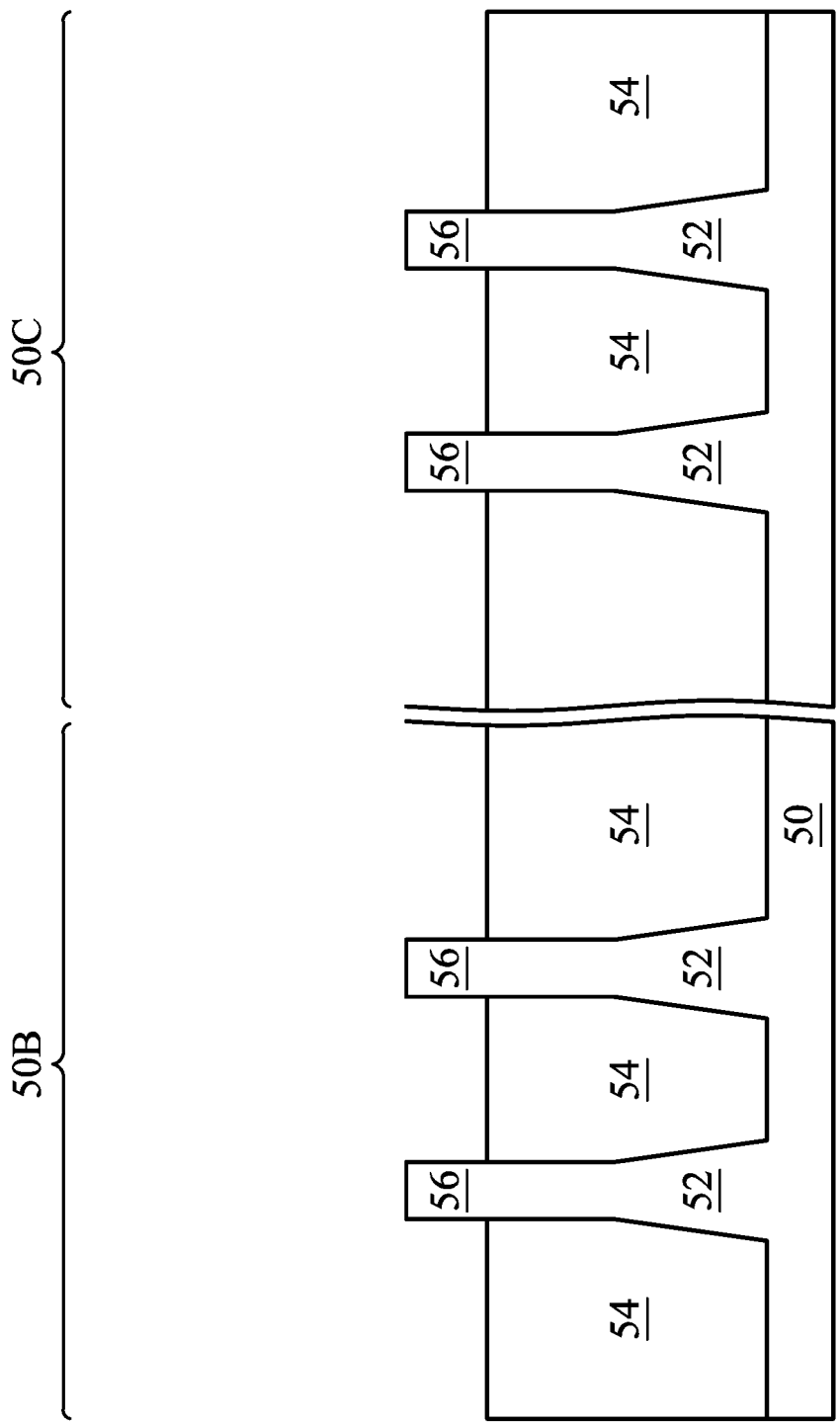

In FIG. 5, the isolation regions 54 are recessed to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how the fins 56 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 4 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may be formed from silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 5, appropriate wells (not shown) may be formed in the fins 56, the fins 52, and/or the substrate 50. In some embodiments, a P well may be formed in the first region 50B, and an N well may be formed in the second region 50C. In some embodiments, a P well or an N well are formed in both the first region 50B and the second region 50C.

In the embodiments with different well types, the different implant steps for the first region 50B and the second region 50C may be achieved using a photoresist or other masks (not shown). For example, a photoresist may be formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region 50C, such as the PMOS region. The p-type impurities may be boron, BF2, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the first region 50B and the second region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 6:
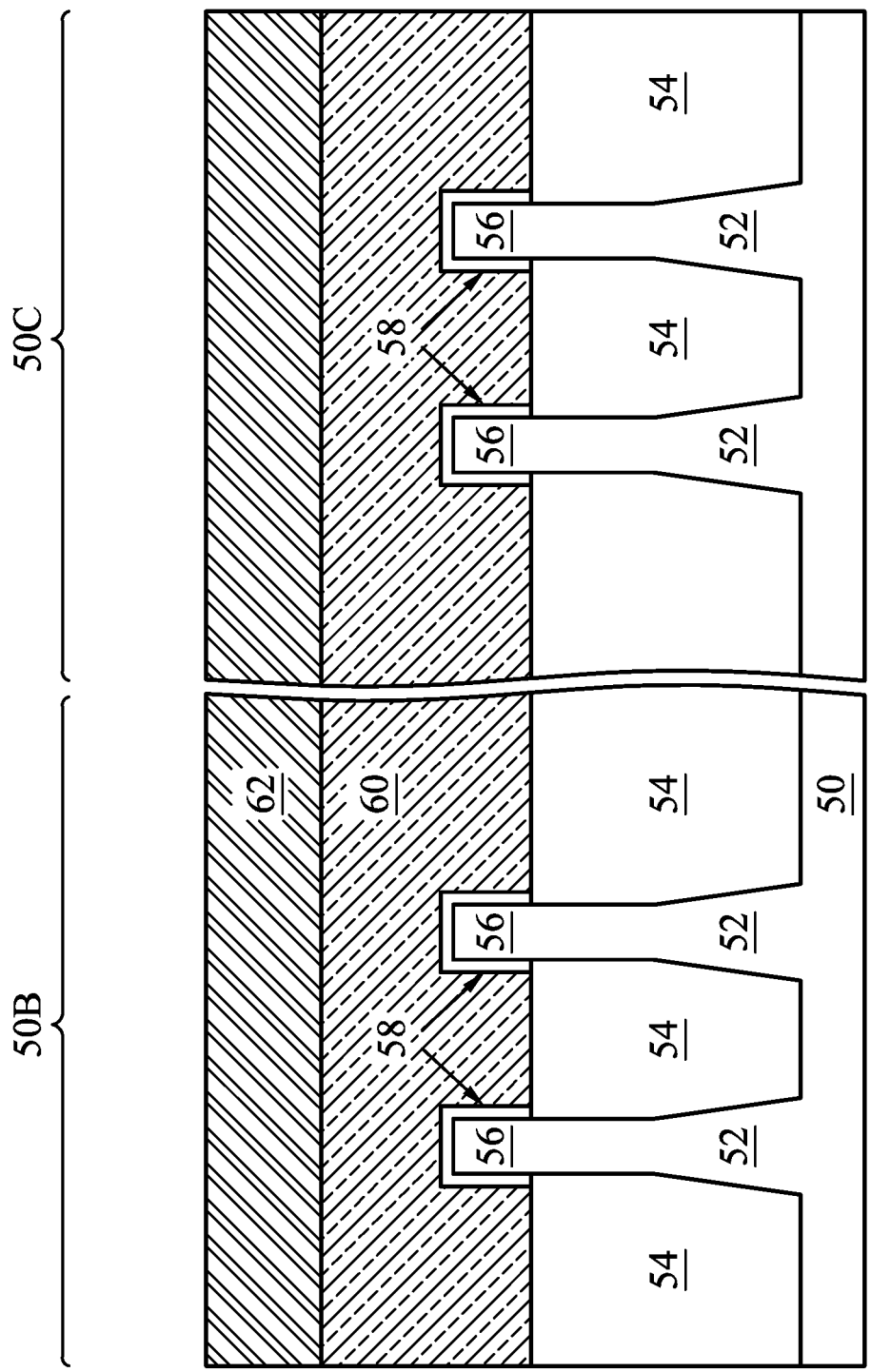

In FIG. 6, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 60 may be deposited by physical vapor deposition (PVD), CVD, sputter deposition, or other techniques known and used in the art for depositing conductive materials. The dummy gate layer 60 may be made of other materials that have a high etching selectivity from the etching of isolation regions. The mask layer 62 may include, for example, SiN, SiON, or the like. In this example, a single dummy gate layer 60 and a single mask layer 62 are formed across the first region 50B and the second region 50C. In some embodiments, separate dummy gate layers may be formed in the first region 50B and the second region 50C, and separate mask layers may be formed in the first region 50B and the second region 50C.

FIGS. 7A through 21B are cross-sectional views of further intermediate stages in the manufacturing of FinFETs in accordance with some embodiments. In FIGS. 7A through 21B, figures ending with an "A" designation are illustrated along reference cross-section A-A illustrated in FIG. 1, except for multiple FinFET. The embodiments shown in FIGS. 7A through 21B illustrate intermediate stages in the manufacturing of n-type devices, such as NMOS transistors, e.g., n-type FinFETs. As such, figures ending with a "B" designation are illustrated along a similar cross-section B-B and in the first region 50B (e.g., the n-type region of substrate 50), and figures ending with a "C" designation are illustrated along a similar cross-section C-C. It should be appreciated that similar techniques could be applied in the manufacturing of p-type devices, such as PMOS transistors, e.g., p-type FinFETs.

Figure 7B:
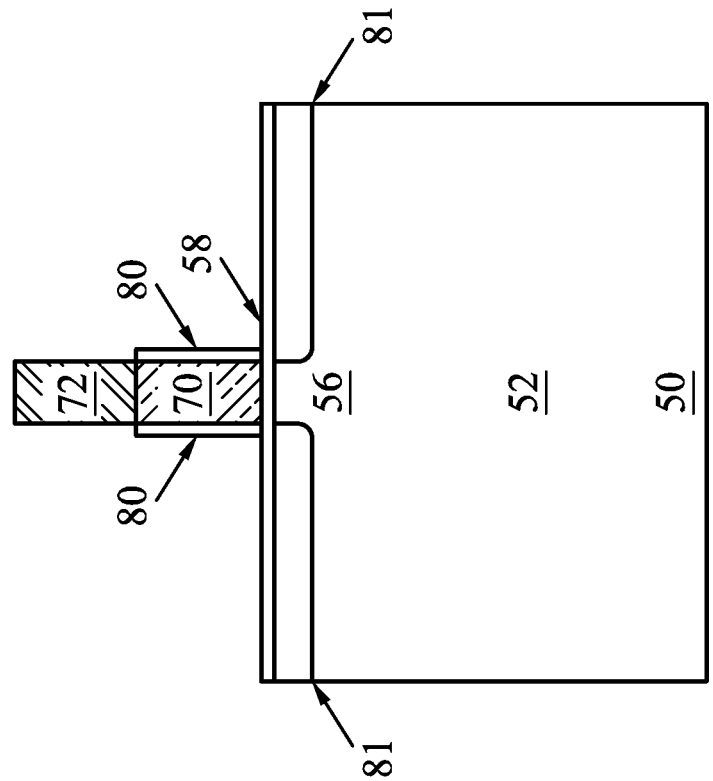
Figure 7A:
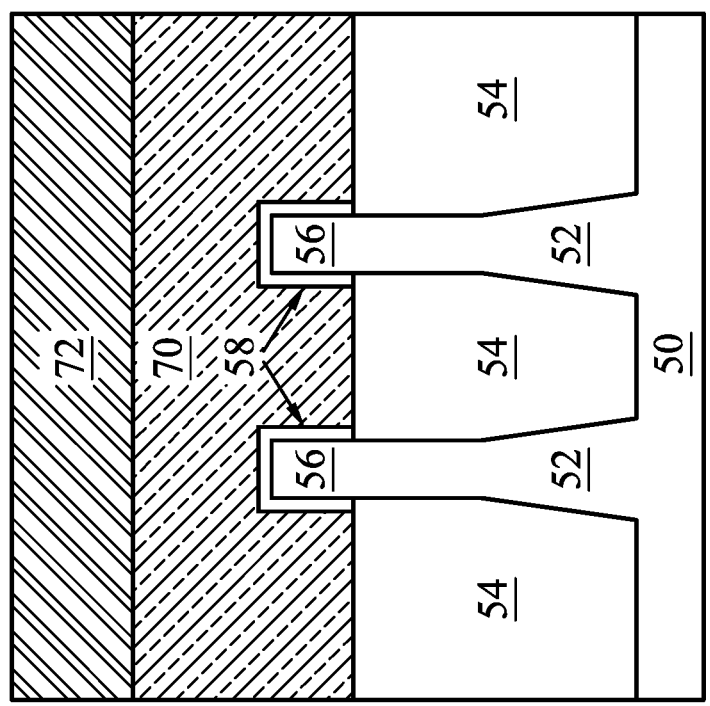

In FIGS. 7A and 7B, the mask layer 62 may be patterned using acceptable photolithography and etching techniques to form masks 72. The pattern of the masks 72 then may be transferred to the dummy gate layer 60 and the dummy dielectric layer 58 by an acceptable etching technique to form dummy gates 70. The dummy gates 70 cover respective channel regions of the fins 56. The dummy gates 70 may also have a lengthwise direction substantially perpendicular to the lengthwise direction of respective epitaxial fins.

Further in FIGS. 7A and 7B, gate seal spacers 80 can be formed on exposed surfaces of the dummy gates 70 and/or the fins 56. A thermal oxidation or a deposition followed by an anisotropic etch may form the gate seal spacers 80. The gate spacers 86 seal the sidewall of the gate stack, and may act as an additional gate spacing layer.

After the formation of the gate seal spacers 80, implants for lightly doped source/drain (LDD) regions 81 may be performed. In the embodiments with different device types, similar to the implants discussed above in FIG. 5, a mask, such as a photoresist, may be formed over the first region 50B, while exposing the second region 50C, and appropriate type (e.g., n-type or p-type) impurities may be implanted into the exposed fins 56 in the second region 50C. The mask may then be removed. Subsequently, a mask, such as a photoresist, may be formed over the second region 50C while exposing the first region 50B, and appropriate type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 8B:
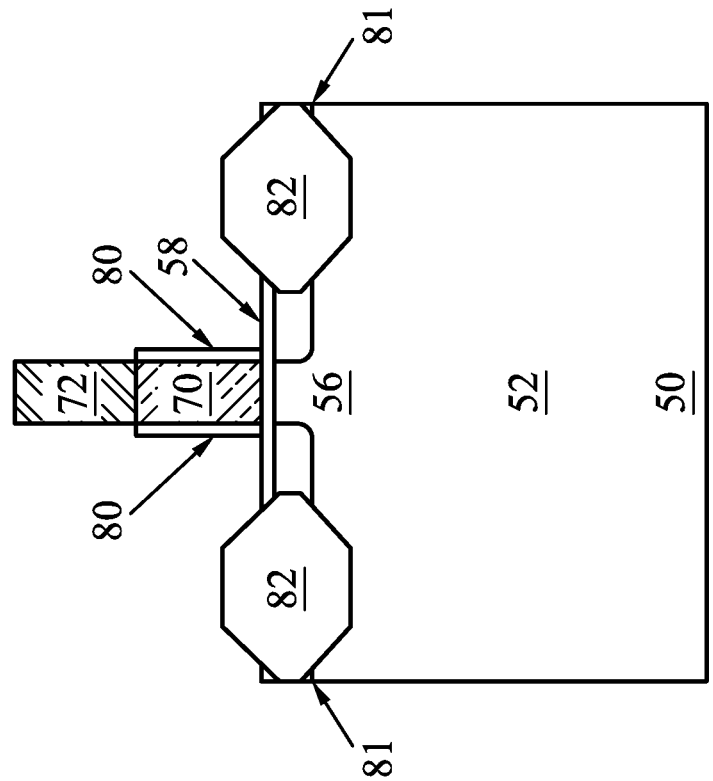
Figure 8A:
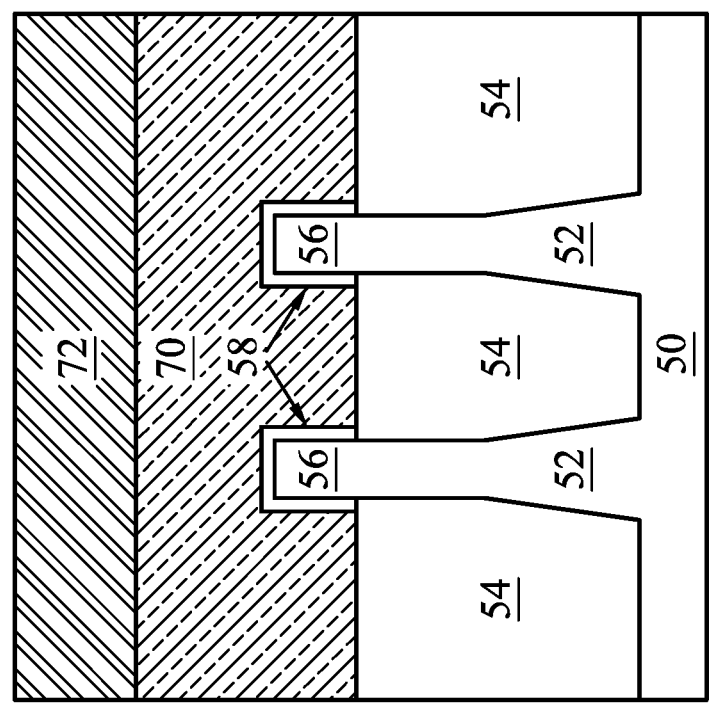

In FIGS. 8A and 8B, epitaxial source/drain regions 82 are formed in the fins 56. The epitaxial source/drain regions 82 are formed in the fins 56 such that each dummy gate 70 is disposed between respective neighboring pairs of the epitaxial source/drain regions 82. In some embodiments that epitaxial source/drain regions 82 may extend through the LDD regions 81.

In the embodiments with different device types, the epitaxial source/drain regions 82 in the regions may be formed in separate processes. In these embodiments, the epitaxial source/drain regions 82 in the first region 50B may be formed by masking the second region 50C and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. If the first region 50B is an n-type device region, the epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. In an embodiment where an n-type device is formed, the epitaxial source/drain regions 82 are P-doped Si (SiP), and are substantially free of Ge. If the first region 50B is a p-type device region, the epitaxial source/drain regions 82 may include any acceptable material, such as appropriate for p-type FinFETs. For example, if the fin 56 is silicon, the epitaxial source/drain regions 82 may be formed from SiGe, SiGeB, Ge, GeSn, or the like. In an embodiment where a p-type device is formed, the epitaxial source/drain regions 82 are B-doped SiGe (SiGe:B), and are substantially free of C. The epitaxial source/drain regions 82 in the first region 50B may have surfaces raised from respective surfaces of the fins 56 and may have facets. Subsequently, the dummy gate spacers in the first region 50B are removed, for example, by an etch, as is the mask on the second region 50C.

After the formation of the epitaxial source/drain regions 82 in the first region 50B, the epitaxial source/drain regions 82 in the second region 50C may be formed by masking the first region 50B and conformally depositing a dummy spacer layer in the second region 50C, followed by an anisotropic etch to form dummy gate spacers (not shown) along sidewalls of the dummy gates 70 and/or gate seal spacers 80 in the second region 50C. Then, source/drain regions of the epitaxial fins in the second region 50C are etched to form recesses. The epitaxial source/drain regions 82 in the second region 50C are epitaxially grown in the recesses. The epitaxial source/drain regions 82 in the second region 50C may include any acceptable material, such as appropriate for p-type FinFETs or n-type FinFETs, as described above. The epitaxial source/drain regions 82 in the second region 50C may have surfaces raised from respective surfaces of the fins 56 and may have facets. Subsequently, the dummy gate spacers in the second region 50C are removed, for example, by an etch, as is the mask on the first region 50B.

In FIGS. 9A and 9B, semiconductor cap layers 84 are formed on the epitaxial source/drain regions 82. The semiconductor cap layers 84 include an impurity. When silicide layers are formed in subsequent processing steps (discussed below), the impurity is diffused into the silicide layers. The epitaxial source/drain regions 82 are substantially free of the impurity in the semiconductor cap layers 84. The semiconductor cap layers 84 may or may not be doped. The impurity in the semiconductor cap layers 84 may be a semiconductor, and may be different from the dopant. In an embodiment where an n-type device is formed, the epitaxial source/drain regions 82 may be formed from SiP, and the semiconductor cap layers 84 may be formed from SiGe. In such embodiments, Ge is the impurity of the semiconductor cap layers 84 that the epitaxial source/drain regions 82 is substantially free of.

The semiconductor cap layers 84 may be formed in situ, e.g., without breaking a vacuum, when forming the epitaxial source/drain regions 82, or may be formed in a separate process. In embodiments where they are formed in situ, the epitaxial source/drain regions 82 may be formed in a first epitaxial growing step, and the semiconductor cap layers 84 may then be formed in a second epitaxial growing step without breaking a vacuum from the first epitaxial growing step. The thicknesses of the semiconductor cap layers 84 may be smaller than the thicknesses of the epitaxial source/drain regions 82. The semiconductor cap layers 84 may have a thickness from about 1 nm to about 10 nm. In embodiments where they are formed in situ, the epitaxial source/drain regions 82 and the semiconductor cap layers 84 may be formed with similar epitaxial growth processes.

Figure 10B:
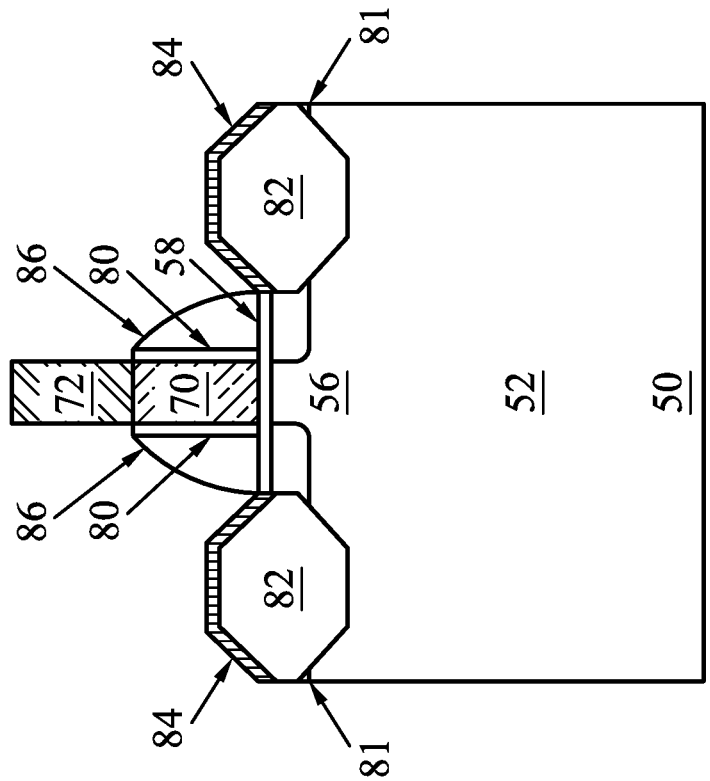
Figure 10A:
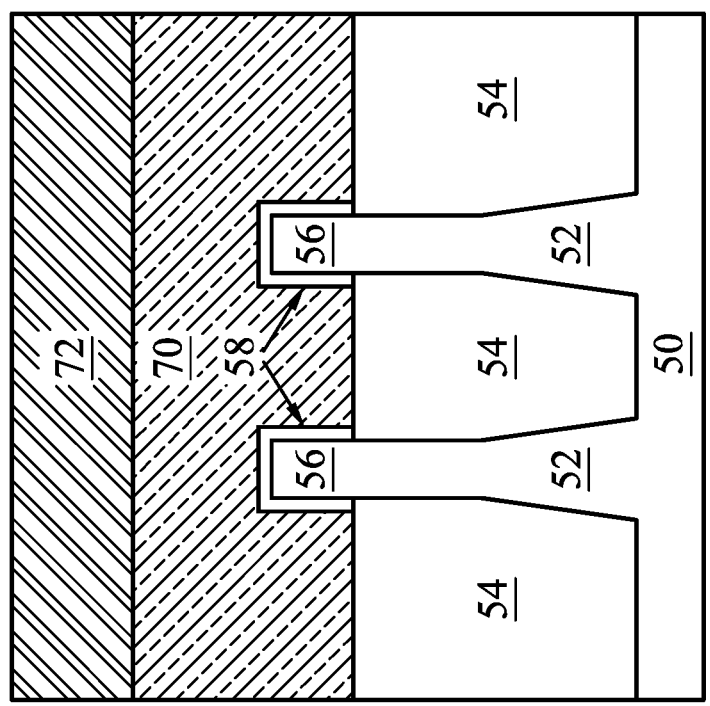

In FIGS. 10A and 10B, gate spacers 86 are formed on the gate seal spacers 80 along sidewalls of the dummy gates 70. The gate spacers 86 may be formed by conformally depositing a material and subsequently anisotropically etching the material. The material of the gate spacers 86 may be silicon nitride, SiCN, a combination thereof, or the like. The etch may be selective to the material of the material of the gate spacers 86, such that the epitaxial source/drain regions 82 are not etched during the formation of the gate spacers 86.

The epitaxial source/drain regions 82, the semiconductor cap layers 84, and/or the epitaxial fins may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the semiconductor cap layers 84 may be doped concurrently with the epitaxial source/drain regions 82. In some embodiments, the epitaxial source/drain regions 82 and/or the semiconductor cap layers 84 may be in situ doped during growth.

Figure 11B:
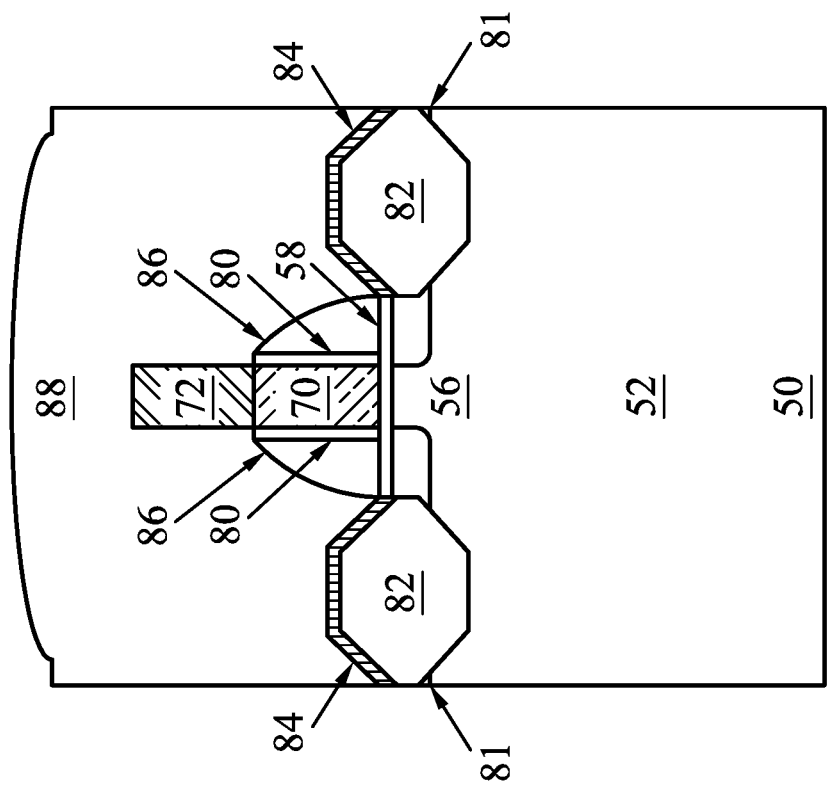
Figure 11A:
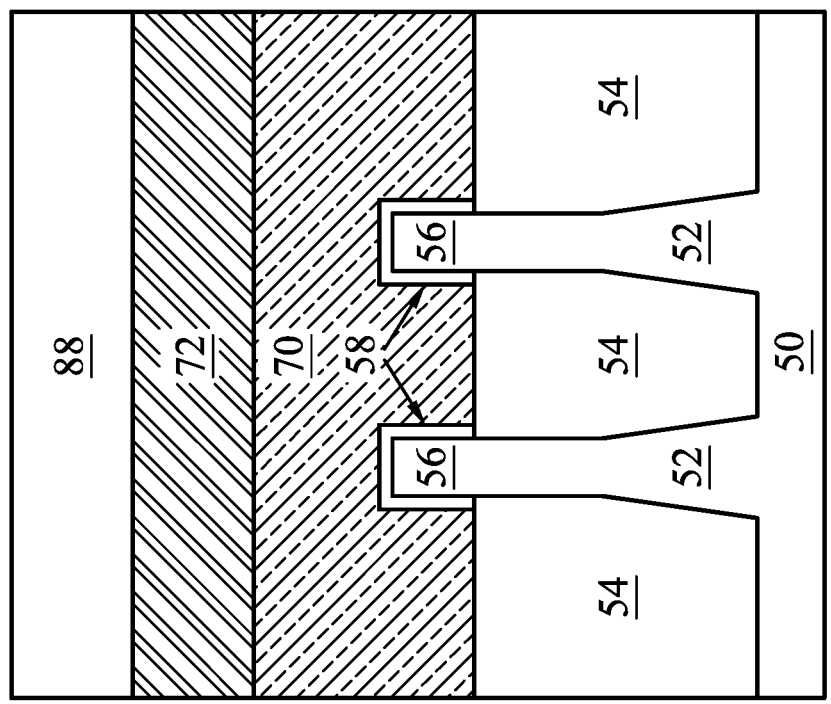

In FIGS. 11A and 11B, an ILD 88 is deposited over the structure illustrated in FIGS. 10A and 10B. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used.

Figure 12B:
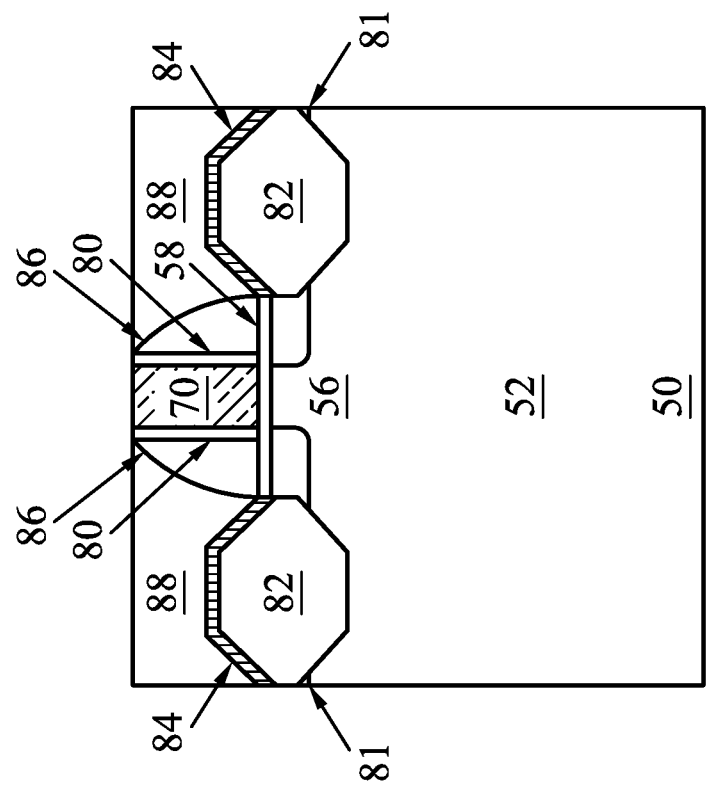
Figure 12A:
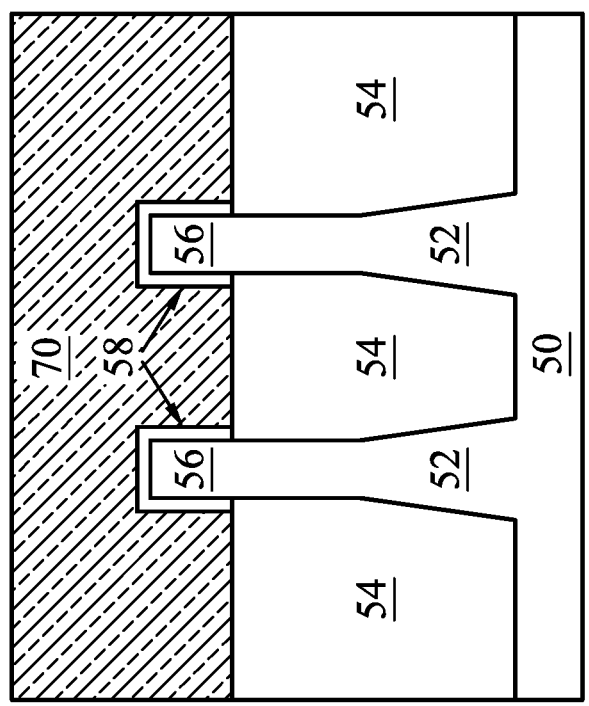

In FIGS. 12A and 12B, a planarization process, such as a CMP, may be performed to level the top surface of the ILD 88 with the top surfaces of the dummy gates 70. The CMP may also remove the masks 72 on the dummy gates 70. Accordingly, the top surfaces of the dummy gates 70 are exposed through the ILD 88.

Figure 13B:
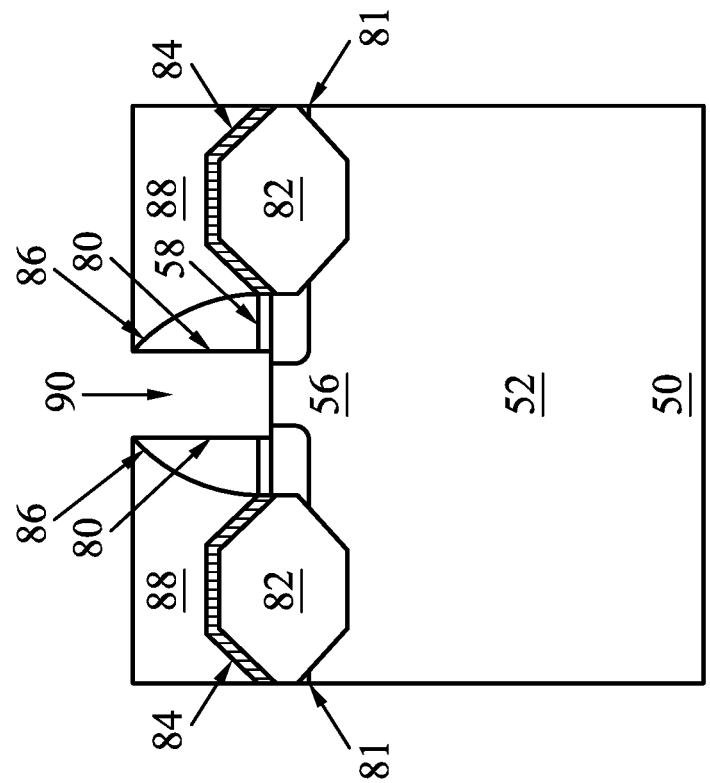
Figure 13A:
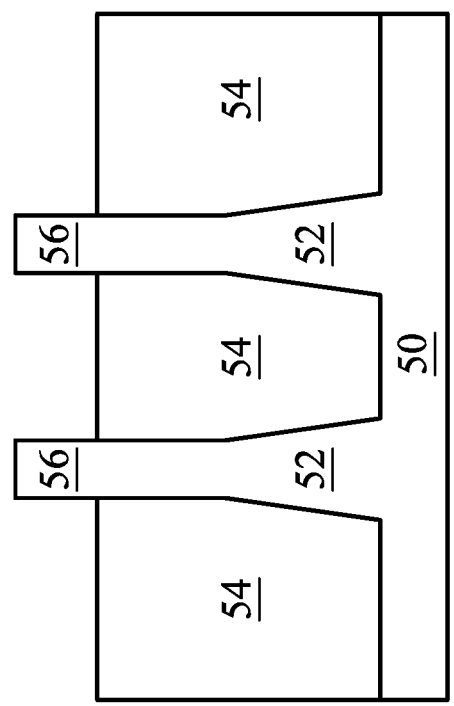

In FIGS. 13A and 13B, the exposed portions of the dummy gates 70, the gate seal spacers 80, and portions of the dummy dielectric layer 58 directly underlying the exposed dummy gates 70 are removed in an etching step(s), so that recesses 90 are formed. In some embodiments, the dummy gates 70 are removed by an anisotropic dry etch process. For example, the etching process may include a dry etch process using reaction gas(es) that selectively etch the dummy gates 70 without etching the ILD 88 or the gate spacers 86. Each recess 90 exposes a channel region of a respective fin. Each channel region is disposed between neighboring pairs of the epitaxial source/drain regions 82. During the removal, the dummy dielectric layer 58 may be used as an etch stop layer when the dummy gates 70 are etched. The dummy dielectric layer 58 and the gate seal spacers 80 may then be removed after the removal of the dummy gates 70.

Figure 14B:
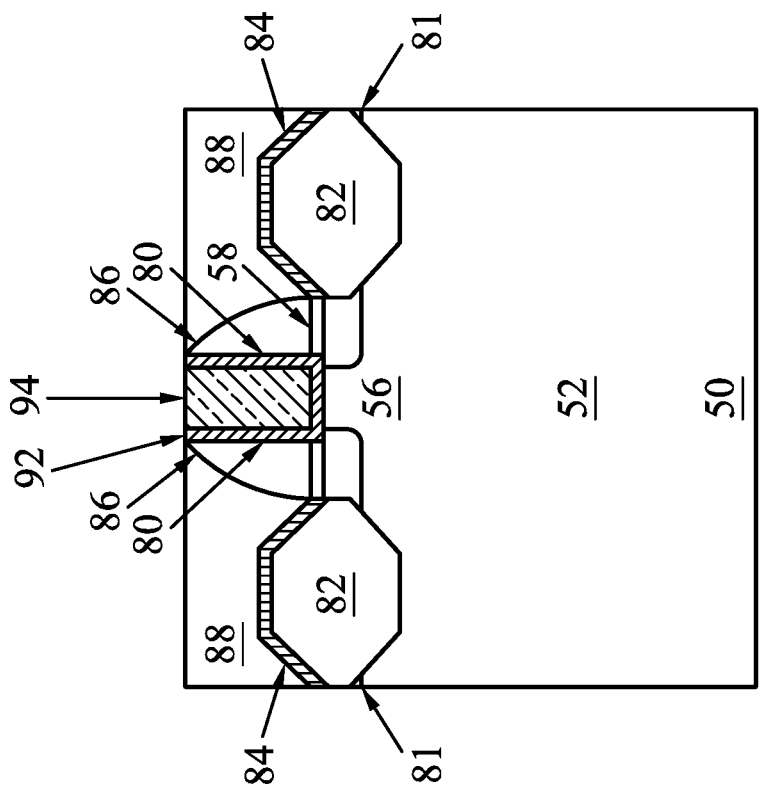
Figure 14A:
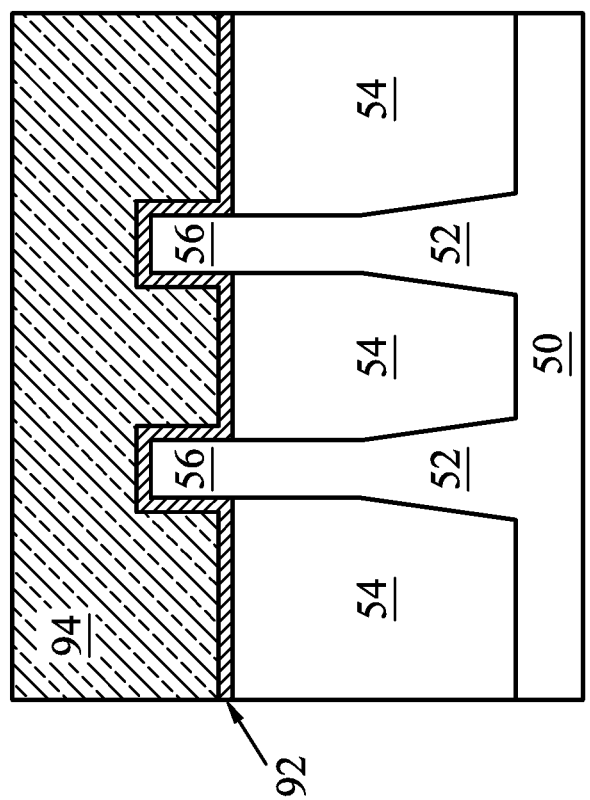

In FIGS. 14A and 14B, gate dielectric layers 92 and gate electrodes 94 are formed for replacement gates. Gate dielectric layers 92 are deposited conformally in the recesses 90, such as on the top surfaces and the sidewalls of the fins 56 and on sidewalls of the gate spacers 86, and on a top surface of the ILD 88. In accordance with some embodiments, the gate dielectric layers 92 are silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. In embodiments where the gate dielectric layers 92 are a high-k dielectric material, interfacial layers (not shown) may be formed on the fins 56, and the gate dielectric layers 92 may be formed on the interfacial layers.

The interfacial layers may be formed of, e.g., SiO$_2$, and may be formed by, e.g., oxidizing the fins 56 in the recesses 90. The formation methods of the gate dielectric layers 92 may include Molecular-Beam Deposition (MBD), Atomic Layer Deposition (ALD), PECVD, and the like.

The gate electrodes 94 are deposited over the gate dielectric layers 92, respectively, and fill the remaining portions of the recesses 90. The gate electrodes 94 may be a metal-containing material such as TiN, TaN, TaC, Co, Ru, Al, combinations thereof, or multi-layers thereof. After the filling of the gate electrodes 94, a planarization process, such as a CMP, may be performed to remove the excess portions of the gate dielectric layers 92 and the material of the gate electrodes 94, which excess portions are over the top surface of the ILD 88. The resulting remaining portions of material of the gate electrodes 94 and the gate dielectric layers 92 thus form replacement gates of the resulting FinFETs. The gate electrodes 94 and the gate dielectric layers 92 may be collectively referred to as a "gate" or a "gate stack."

The formation of the gate dielectric layers 92 in the first region 50B and the second region 50C may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 15B:
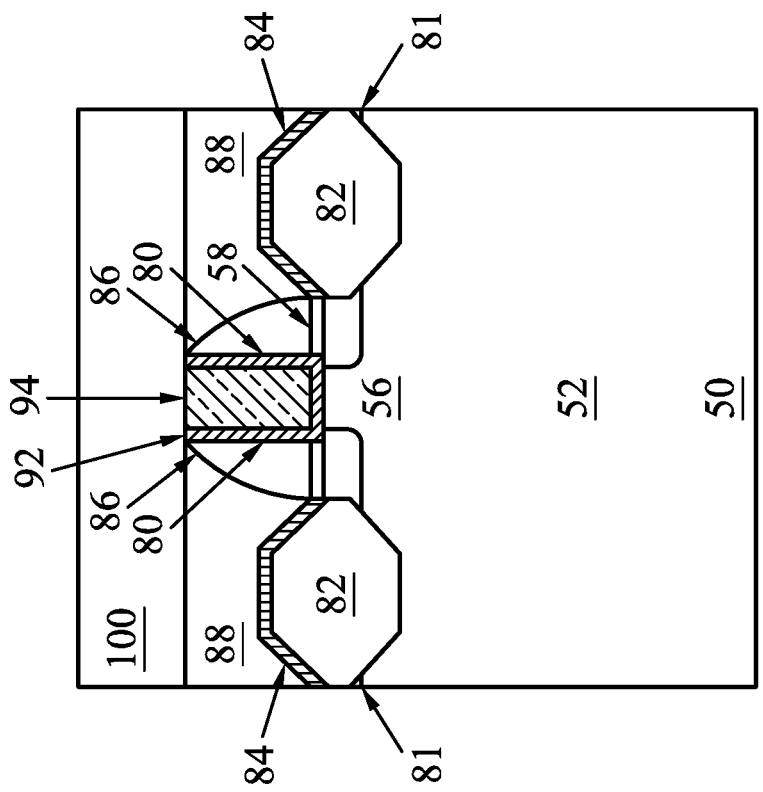
Figure 15A:
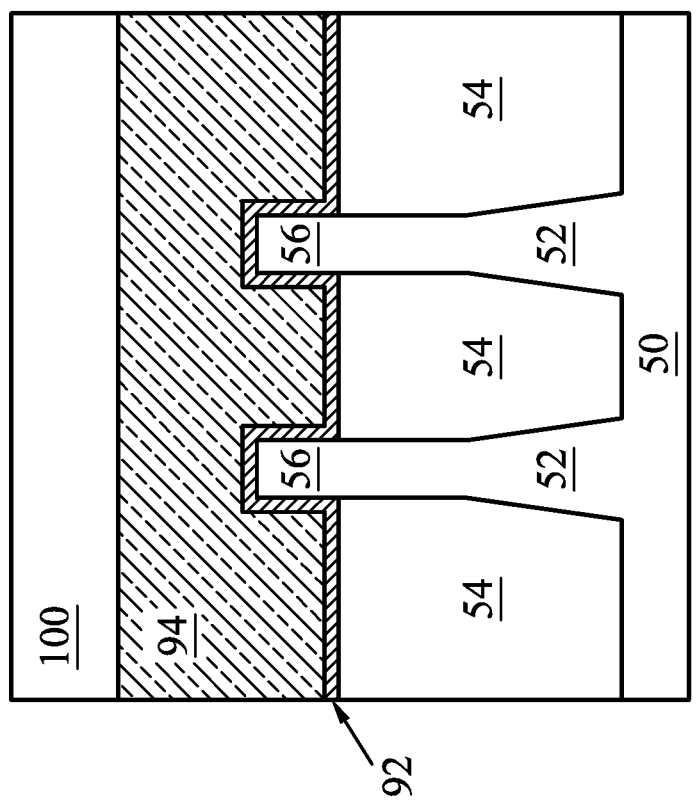

In FIGS. 15A and 15B, an ILD 100 is deposited over the ILD 88. In an embodiment, the ILD 100 is a flowable film formed by a flowable CVD method. In some embodiments, the ILD 100 is formed of a dielectric material such as PSG, BSG, BPSG, USG, or the like, and may be deposited by any suitable method, such as CVD and PECVD.

In FIGS. 16A and 16B, openings 112 for contacts are formed through the ILD 88 and the ILD 100. The top surfaces of the semiconductor cap layers 84 are exposed by the openings 112. The openings 112 may all be formed simultaneously in a same process, or in separate processes, and may be formed using acceptable photolithography and etching techniques.

In FIGS. 17A and 17B, a metal layer 114 is formed in the openings 112. The metal layer 114 may be conformally formed on the top surface of the ILD 100, the sidewalls of the ILD 88, and the top surfaces of the semiconductor cap layers 84. The metal layer 114 may be deposited by any suitable method, such as PVD, CVD, and PECVD. In an embodiment, the metal layer 114 is formed from Ti or Co, although it should be appreciated that any suitable metal may be used.

In some embodiments, a liner (not shown) is also formed in the openings 112. The liner may be a diffusion barrier layer, an adhesion layer, or the like, and may prevent the metal layer 114 from diffusing into the ILD 88 or the ILD 100. The liner may include titanium, titanium nitride, tantalum, tantalum nitride, or the like.

Figure 18A:
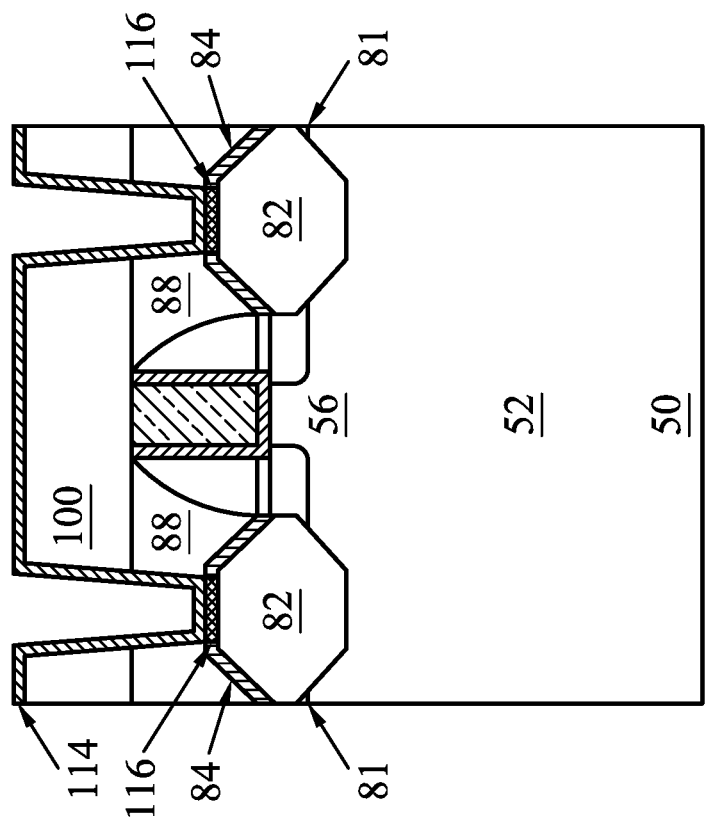
Figure 18B:
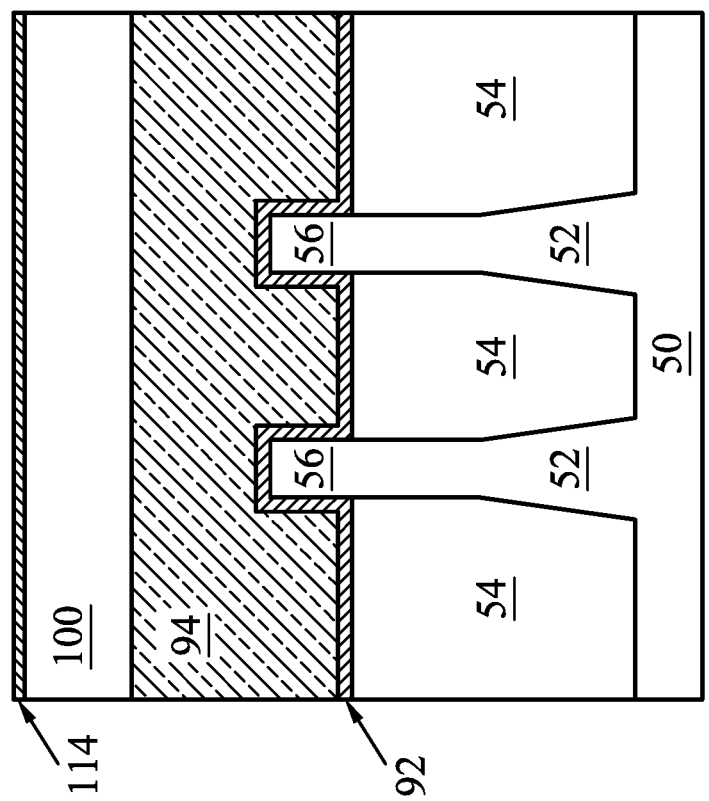

In FIGS. 18A and 18B, an anneal process is performed to form silicide layers 116 at the interface between the semiconductor cap layers 84 and the metal layer 114. In some embodiments, the anneal process consumes substantially all of the semiconductor cap layers 84 and/or the metal layer 114 at the bottom of the openings 112. In some embodiments, only portions of the semiconductor cap layers 84 and/or the metal layer 114 are consumed.

During formation of the silicide layers 116, the impurities in the semiconductor cap layers 84 diffuse into the silicide layers 116. In embodiments where only portions of the semiconductor cap layers 84 are consumed, some or all of the impurities (e.g., Ge) in the remaining portions of the semiconductor cap layers 84 may migrate and diffuse into the silicide layers 116. For example, impurities in portions of the semiconductor cap layers 84 not contacting the metal layer 114 may diffuse into the silicide layers 116. A semiconductor material in the semiconductor cap layers 84 forms a silicide with the metal of the metal layers 114, and the impurity in the semiconductor cap layers 84 becomes an impurity in the silicide layers 116. When the epitaxial source/drain regions 82 are formed of Si, the semiconductor cap layers 84 are formed of SiGe, and the metal layer 114 is formed of Ti, the silicide layers 116 comprise TiSi$_2$ that is rich with Ge impurities. Likewise, when the metal layer 114 is formed of Co, the silicide layers 116 comprise CoSi$_2$ that is rich with Ge impurities. For n-type devices, the Ge impurities in the silicide layers 116 alter the band structure of the metal-semiconductor junction such that the Fermi level may be de-pinned. This may lower the Schottky barrier height of the metal-semiconductor junction, thereby reducing the contact resistance of the junction.

Figure 18C:
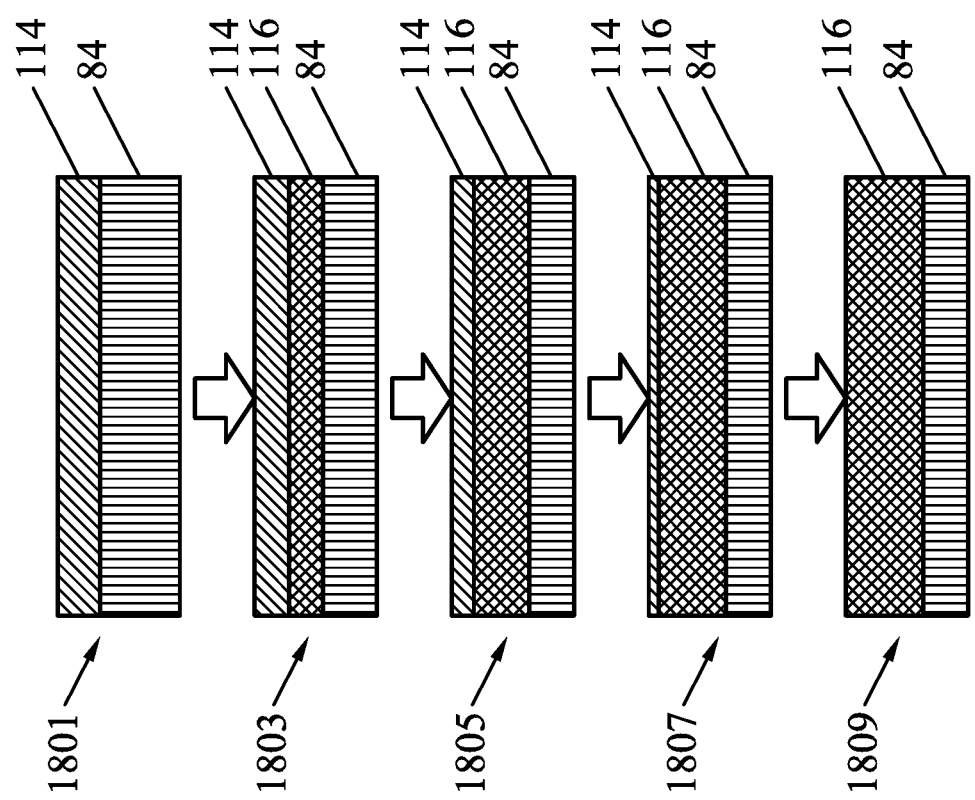

The anneal process includes performing one or more annealing steps or processes. Each successive annealing step may be performed at a higher temperature. The one or more annealing steps for forming the silicide layers 116 are illustrated in FIG. 18C. In step 1801, the metal layer 114 is deposited on the semiconductor cap layers 84. In step 1803, the device is heated to a temperature of about 300° C., for a time span from about 200-500 seconds, such as about 250 seconds. In step 1805, the device is heated to a temperature of about 500° C., for a time span from about 200-500 seconds, such as about 250 seconds. In step 1807, the device is heated to a temperature of about 600° C., for a time span from about 200-500 seconds, such as about 250 seconds. The Ge of the semiconductor cap layers 84 begins expulsion during step 1807. In step 1809, the device is held at about 600° C. for a time span from about 100-200 seconds. The Ge of the semiconductor cap layers 84 begins segregation during step 1809. As the annealing temperature increases in each subsequent annealing step, the Ge of the semiconductor cap layers 84 segregates at the crystalline grain boundaries of the TiSi$_2$ of the silicide layers 116. After the final anneal process (e.g., step 1809), the semiconductor cap layers 84 may be substantially pure SiP or Si, as the Ge of the semiconductor cap layers 84 has segregated to fine crystalline grain boundaries of the silicide layers 116. Further, because Ge is a larger atom, diffusion of dopants from the epitaxial source/drain regions 82 (e.g., P when SiP is used) into the semiconductor cap layers 84 may occur, which may help with strain engineering of the epitaxial source/drain regions 82 and/or the semiconductor cap layers 84. After the one or more annealing steps, some or all of the semiconductor cap layers 84 and the metal layer 114 may be consumed. For example, both layers may be fully consumed, neither layer may be fully consumed, the semiconductor cap layers 84 may not be consumed while the metal layer 114 is consumed, or the semiconductor cap layers 84 may be consumed while the metal layer 114 is not consumed. The amount of each layer that is consumed depends on the material properties of the semiconductor cap layers 84 and the metal layer 114.

In embodiments where the epitaxial source/drain regions 82 are formed of Si or SiP and the semiconductor cap layers 84 are formed of SiGe of SiGeP (e.g., for NMOS devices), the silicide layers 116 may have a thickness from about 1% to 20% of the thickness of the epitaxial source/drain regions 82. The concentration of the impurities in the epitaxial source/drain regions 82 and the silicide layers 116 may vary at different depths. In an embodiment, the concentration of Ge is about 1% at the surface of the silicide layers 116, increases to about 3.5% at depths where the semiconductor cap layers 84 was, and decreases to less than 1% as the depth increases into the epitaxial source/drain regions 82. In other words, most of the impurities may be concentrated at a depth of slightly below the top surface of the silicide layers 116. In an embodiment, the Ge concentration is from about 1% to about 20%, and the majority of it is at a depth of from about 1 nm to about 10 nm.

An etching process (not shown) may be performed to flatten the silicide layers 116 on the epitaxial source/drain regions 82. The etching may include the use of an etchant such as $GeH_4$.

Figure 19A:
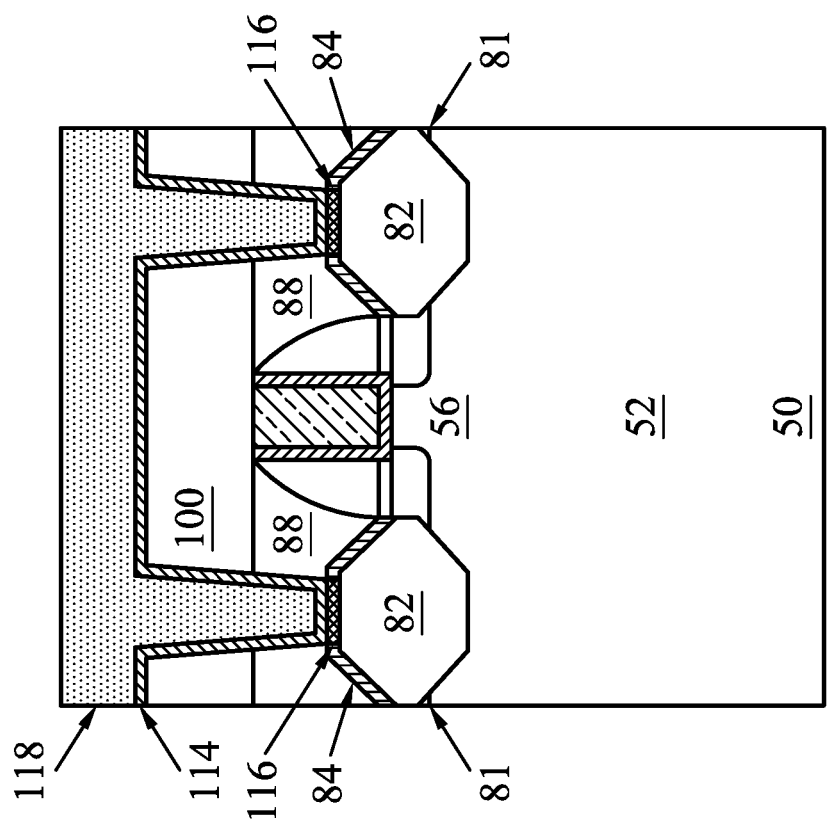
Figure 19B:
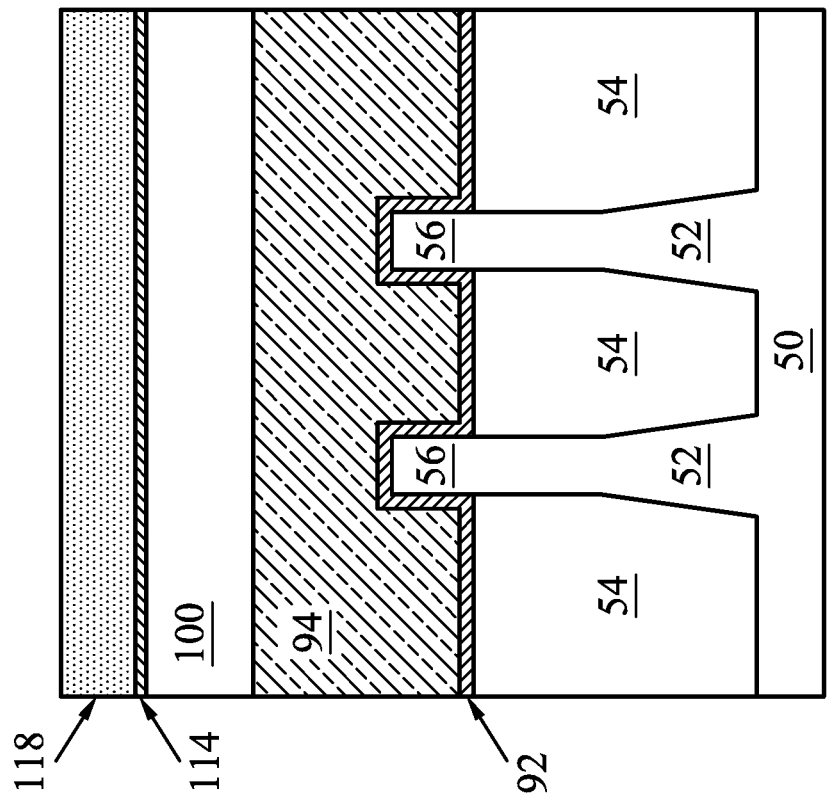

In FIGS. 19A and 19B, a conductive material 118 is formed over the metal layer 114 and in the openings 112. The conductive material 118 may be copper, a copper alloy, silver, gold, tungsten, aluminum, nickel, cobalt, or the like.

Figure 20C:
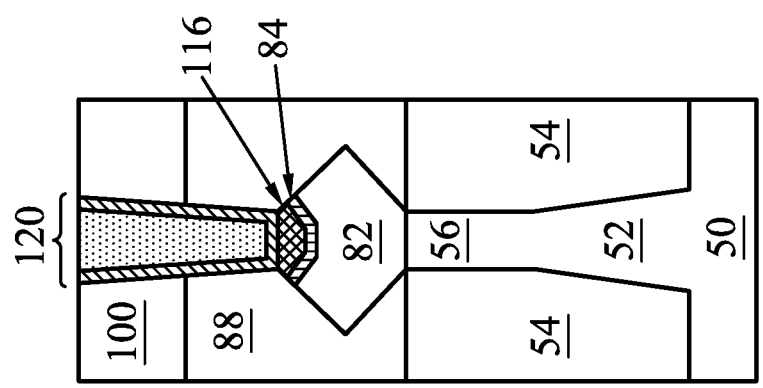

In FIGS. 20A, 20B, and 20C, a planarization process, such as a CMP, is performed to remove excess material from a surface of the ILD 100. The planarization process removes portions of the metal layer 114 and the conductive material 118 overlying and extending along the top surface of the ILD 100. The remaining portions of the metal layer 114 and the conductive material 118 in the openings 112 forms contacts 120. The contacts 120 are electrically coupled to the epitaxial source/drain regions 82 through the silicide layers 116, and are physically coupled to the silicide layers 116. As shown in FIG. 20C, the epitaxial source/drain regions 82 have surfaces raised from respective surfaces of the fins 56, and the semiconductor cap layers 84 and silicide layers 116 are on a top surface of the epitaxial source/drain regions 82.

Figure 21B:
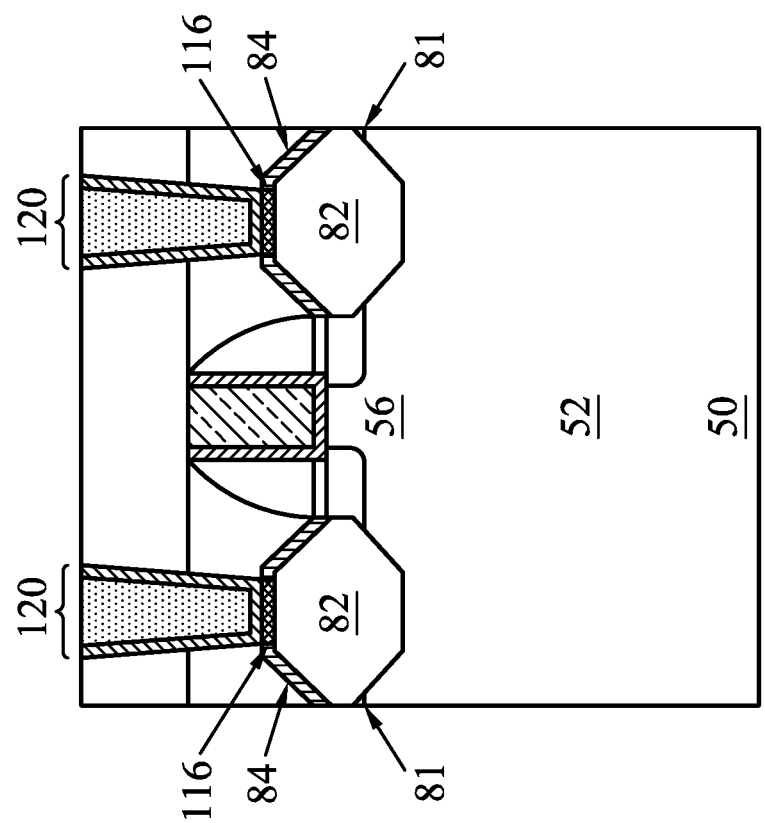
Figure 21A:
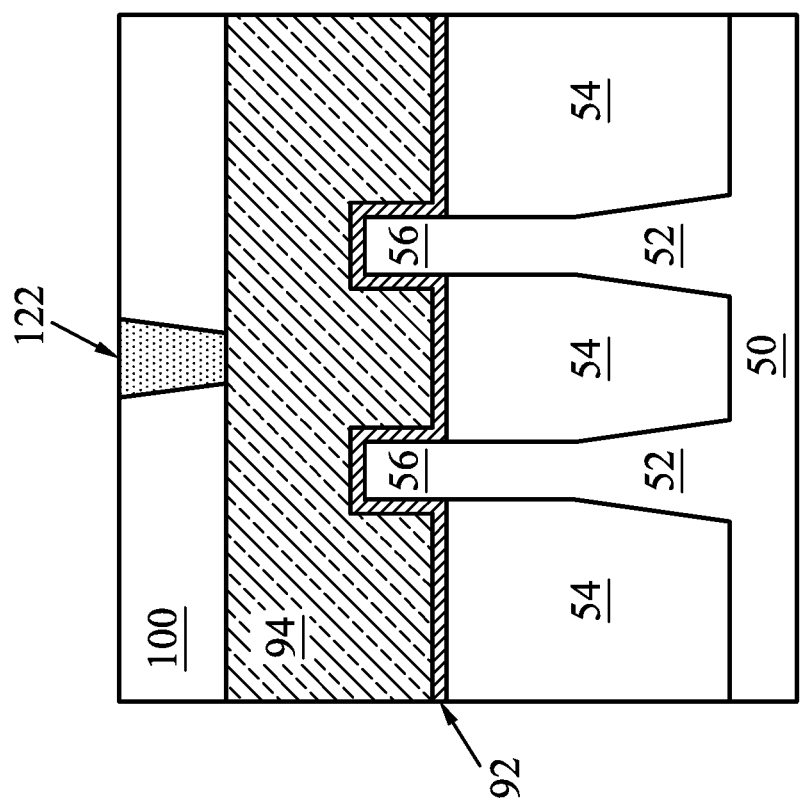

In FIGS. 21A and 21B, a contact 122 is formed electrically and physically coupled to the gate electrode 94. The contact 122 may be formed in a matter similar to the contacts 120, or may be formed differently, and may be formed in a same process or a different process. In embodiments where the contact 122 is formed in a different process, an opening for the contact 122 is formed through the ILD 100 The opening may be formed using acceptable photolithography and etching techniques. A liner, such as a diffusion barrier layer, an adhesion layer, or the like, and a conductive material are formed in the opening. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material forms the contact 122 in the opening. The contact 122 is physically and electrically coupled to the gate electrode 94.

In some embodiments, wires (not shown) may optionally be formed simultaneously with the contacts 120. The wires may couple the contacts 120 to other devices. In such embodiments, a hardmask is formed over the ILD 100, a dielectric layer is formed over the hardmask, and a silicon layer is formed over the dielectric layer. The silicon layer may be patterned, e.g., with a tri-layer lithography. A first etching process may be performed to form the openings 112 in the dielectric layer, the hardmask, and a first portion of the ILD 100. A second etching process may be performed using the patterned silicon layer as a mask to simultaneously extend the openings 112 through the ILD 100 to expose the silicide layers 116 and/or the semiconductor cap layers 84, and form trenches in portions of the dielectric layer exposed by the patterned silicon layer. The conductive material 118 may be formed in both the openings and the trenches, simultaneously forming the contacts 120 and the wires.

FIGS. 22A through 23B are cross-sectional views of further intermediate stages in the manufacturing of FinFETs in accordance with some embodiments. In FIGS. 22A through 23B, figures ending with an "A" designation are illustrated along reference cross-section A-A illustrated in FIG. 1, except for multiple FinFET. The embodiments shown in FIGS. 22A through 23B illustrate intermediate stages in the manufacturing of n-type devices, such as NMOS transistors, e.g., n-type FinFETs. As such, figures ending with a "B" designation are illustrated along a similar cross-section B-B and in the first region 50B (e.g., the n-type region of substrate 50). It should be appreciated that similar techniques could be applied in the manufacturing of p-type devices, such as PMOS transistors, e.g., p-type FinFETs.

In FIGS. 22A and 22B, the semiconductor cap layers 84 are not formed in situ with and on the epitaxial source/drain regions 82. Instead, the epitaxial source/drain regions 82 are formed, then the ILD 88 and the ILD 100 are deposited over the epitaxial source/drain regions 82. The openings 112 are formed, exposing the top surfaces of the epitaxial source/drain regions 82. The semiconductor cap layers 84 are then epitaxially grown in the openings 112 on the surfaces of the epitaxial source/drain regions 82. The semiconductor cap layers 84 may be formed using a process similar to that used to form the epitaxial source/drain regions 82

In FIGS. 23A and 23B, the contacts 120 are formed in the openings 112. As part of the formation of the contacts 120, the silicide layers 116 are formed on the semiconductor cap layers 84. The silicide layers 116 are formed using a similar process as that discussed above with respect to FIGS. 19A and 19B, and so details will not be repeated herein. The silicide layers 116 may consume some or all of the semiconductor cap layers 84 in the openings 112. As a result, the contact 120 is in electrical contact with the epitaxial source/drain regions 82 and in physical contact with the silicide layers 116. The contact 122 is formed in physical and electrical connection with the gate electrode 94.

Embodiments may achieve advantages. Forming an impurity such as Ge near the top of the source/drain region may increase the rate of silicidation, and increase the rate of consumption of Si in the source/drain region during formation of a $TiSi_2$ silicide. In particular, because of self-interstitial defects that may be present in Si, Si atoms may tend to diffuse into the crystal lattice structure of the $TiSi_2$, thereby replacing Ge atoms in the lattice. By reducing the contact resistance of the source/drain contacts, leakage current may be decreased and drive currents may be increased. By reducing the leakage current, the thermal budget may be reduced. Addition of the Ge impurities to the silicide may help de-pin the fermi level, reducing the Schottky barrier height and the contact resistance of the source/drain contact. Adding Ge to the silicide may further lower the contact resistance compared to a silicide without Ge, such as pure $CoTi_2$ or $TiSi_2$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate stack over a substrate;
    growing a source/drain region adjacent the gate stack in a first growing step, the source/drain region being n-type doped Si;
    growing a semiconductor cap layer on the source/drain region in a second growing step after the first growing step, the first growing step and the second growing step being performed in situ without breaking a vacuum, the semiconductor cap layer being Si doped with Ge impurities;
    forming an inter-layer dielectric (ILD) over the semiconductor cap layer and the source/drain region;
    forming an opening in the ILD, the opening exposing a top surface of the semiconductor cap layer;
    depositing a metal layer in the opening and on the top surface of the semiconductor cap layer;
    annealing the metal layer and the semiconductor cap layer to form a silicide layer over the source/drain region, wherein during the annealing, the Ge impurities in the semiconductor cap layer segregate to the silicide layer, wherein after the annealing, substantially all of the Ge impurities in the semiconductor cap layer are segregated to the silicide layer; and
    forming a metal contact electrically coupled to the silicide layer.

2. The method of claim 1, wherein the silicide layer has a concentration of the Ge impurities in a range of 1% to 20%.

3. The method of claim 2, wherein a largest concentration of the Ge impurities in the silicide layer is located at a point disposed a first depth from a top surface of the silicide layer, the first depth being in a range of 1 nm to 10 nm.

4. The method of claim 1, wherein the annealing the metal layer and the semiconductor cap layer comprises performing a plurality of annealing processes, each successive one of the annealing processes being performed at a higher temperature than a previous one of the annealing processes.

5. The method of claim 4, wherein the silicide layer is a first material compound, and substantially all of the Ge impurities in the semiconductor cap layer are segregated at grain boundaries of the first material compound after a final annealing process of the annealing processes.

6. The method of claim 5, wherein the first material compound is $TiSi_2$.

7. The method of claim 5, wherein the first material compound is $CoSi_2$.

8. The method of claim 1, wherein a thicknesses of the semiconductor cap layer is less than a thicknesses of the source/drain region before the annealing.

9. The method of claim 1, wherein annealing the metal layer and the semiconductor cap layer consumes all of the semiconductor cap layer exposed by the opening.

10. The method of claim 1, wherein annealing the metal layer and the semiconductor cap layer does not consume all of the semiconductor cap layer.

11. A method comprising:
    forming a fin extending from a substrate;
    forming a gate stack on a channel region of the fin;
    growing a source/drain region adjacent the channel region of the fin, the source/drain region being silicon (Si) doped with phosphorus (P) impurities;
    growing a semiconductor cap layer on the source/drain region, the semiconductor cap layer being Si doped with germanium (Ge) impurities;
    forming an inter-layer dielectric (ILD) on the semiconductor cap layer;
    etching an opening in the ILD, the opening exposing a first portion of the semiconductor cap layer, a second portion of the semiconductor cap layer remaining covered by the ILD;
    depositing a first conductive layer on the first portion of the semiconductor cap layer;
    annealing the first conductive layer and the semiconductor cap layer to form a silicide layer on the source/drain region, wherein the annealing is performed until substantially all of the Ge impurities in the first portion of the semiconductor cap layer have segregated to the silicide layer; and
    depositing a second conductive material on the silicide layer.

12. The method of claim 11, wherein annealing the first conductive layer and the semiconductor cap layer consumes all of the first portion of the semiconductor cap layer.

13. The method of claim 11, wherein annealing the first conductive layer and the semiconductor cap layer consumes the first portion of the semiconductor cap layer, the second portion of the semiconductor cap layer remaining unconsumed.

14. The method of claim 11, wherein annealing the first conductive layer and the semiconductor cap layer comprises performing a plurality of annealing processes, each successive one of the annealing processes being performed at a higher temperature than a previous one of the annealing processes, wherein substantially all of the Ge impurities in the first portion of the semiconductor cap layer segregate to the silicide layer after a final annealing process of the annealing processes.

15. The method of claim 11, wherein a largest concentration of the Ge impurities in the silicide layer is located at a point disposed a first depth from a top surface of the silicide layer.

16. A method comprising:
    forming a gate stack over a substrate;
    growing a source/drain region adjacent the gate stack, the source/drain region being n-type doped Si;
    growing a semiconductor cap layer over the source/drain region, the semiconductor cap layer having Ge impurities, the source/drain region being free of the Ge impurities;
    depositing a metal layer over the semiconductor cap layer;
    annealing the metal layer and the semiconductor cap layer to form a silicide layer over the source/drain region, wherein during the annealing, the Ge impurities in the semiconductor cap layer segregate to the silicide layer, wherein after the annealing, substantially all of the Ge impurities in the semiconductor cap layer are segregated to the silicide layer; and
    depositing a conductive material over the silicide layer.

17. The method of claim 16, wherein the source/drain region and the semiconductor cap layer are grown in different growth processes, the growth processes being performed in situ without breaking a vacuum between the growth processes, and further comprising:

forming an inter-layer dielectric (ILD) over the semiconductor cap layer; and etching an opening in the ILD, the opening exposing the semiconductor cap layer, wherein the metal layer and the conductive material are each formed in the opening.

18. The method of claim 16 further comprising:

forming an inter-layer dielectric (ILD) over the source/drain region; and etching an opening in the ILD, the opening exposing the source/drain region, wherein the semiconductor cap layer, the metal layer, and the conductive material are each formed in the opening.

19. The method of claim 16, wherein annealing the metal layer and the semiconductor cap layer comprises performing a plurality of annealing processes, each successive one of the annealing processes being performed at a higher temperature than a previous one of the annealing processes, wherein substantially all of the Ge impurities in the semiconductor cap layer are segregated at grain boundaries of a material of the silicide layer after a final annealing process of the annealing processes.

20. The method of claim 16, wherein a largest concentration of the Ge impurities in the silicide layer is located at a point disposed a first depth from a top surface of the silicide layer.

* * * * *